United States Patent
Park et al.

(10) Patent No.: US 9,941,135 B2
(45) Date of Patent: Apr. 10, 2018

(54) METHODS OF FORMING A HARD MASK LAYER AND OF FABRICATING A SEMICONDUCTOR DEVICE USING THE SAME

(71) Applicant: SAMSUNG ELECTRONICS CO., LTD., Suwon-si, Gyeonggi-do (KR)

(72) Inventors: Sejun Park, Seoul (KR); Dohyung Kim, Uijeongbu-si (KR); Jaihyung Won, Seoul (KR); Sangho Roh, Seoul (KR); Eunsol Shin, Seoul (KR); Seung Moo Lee, Suwon-si (KR); Gyuwan Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 238 days.

(21) Appl. No.: 14/840,114

(22) Filed: Aug. 31, 2015

(65) Prior Publication Data
US 2016/0099155 A1    Apr. 7, 2016

(30) Foreign Application Priority Data

Oct. 1, 2014 (KR) .................. 10-2014-0132455

(51) Int. Cl.
*H01L 21/308* (2006.01)
*H01L 21/311* (2006.01)
(Continued)

(52) U.S. Cl.
CPC .......... *H01L 21/3081* (2013.01); *C23C 16/26* (2013.01); *C23C 16/56* (2013.01);
(Continued)

(58) Field of Classification Search
CPC ........... H01L 21/0228; H01L 21/02274; H01L 21/31144; H01L 21/02112;
(Continued)

(56) References Cited

U.S. PATENT DOCUMENTS 6,835,663 B2    12/2004    Lipinski
7,079,740 B2    7/2006    Vandroux et al.
(Continued)

FOREIGN PATENT DOCUMENTS

JP    2007-224383 S    9/2007
JP    2008-291344 A    12/2008
(Continued)

OTHER PUBLICATIONS

Seok-Jun Won et al., "The Formation of an Almost Full Atomic Monolayer via Surface Modification by N2O-Plasma in Atomic Layer Deposition of ZrO2 Thin Films", Chemistry of Materials Article(2009), 21, pp. 4374-4379.
(Continued)

*Primary Examiner* — Bac Au
(74) *Attorney, Agent, or Firm* — Volentine & Whitt, PLLC

(57) ABSTRACT

A method of forming a hard mask layer on a substrate includes forming an amorphous carbon layer using nitrous oxide ($N_2O$). A source of carbon and the nitrous oxide ($N_2O$) are introduced to the substrate under a plasma ambient of an inert gas. The amorphous carbon layer has a nitrogen content ranging from about 0.05 at % to about 30 at % and an oxygen content ranging from about 0.05 at % to about 10 at %. In forming a semiconductor device, the hard mask layer is patterned, and a target layer beneath the hard mask layer is etched using the patterned hard mask layer as an etch mask.

18 Claims, 24 Drawing Sheets

(51) Int. Cl.
*H01L 21/762* (2006.01)
*C23C 16/26* (2006.01)
*C23C 16/56* (2006.01)
*H01L 21/02* (2006.01)
*H01L 29/423* (2006.01)
*H01L 27/108* (2006.01)

(52) U.S. Cl.
CPC .. *H01L 21/02115* (2013.01); *H01L 21/02266* (2013.01); *H01L 21/02274* (2013.01); *H01L 21/31144* (2013.01); *H01L 21/762* (2013.01); H01L 27/10814 (2013.01); H01L 27/10852 (2013.01); H01L 27/10855 (2013.01); *H01L 27/10888* (2013.01); *H01L 29/4236* (2013.01)

(58) Field of Classification Search
CPC ........... H01L 21/02271; H01L 21/0332; H01L 21/3081; H01L 21/02115; H01L 21/02266; H01L 21/762; C23C 16/56; C23C 16/26

See application file for complete search history.

(56) References Cited

U.S. PATENT DOCUMENTS

| | | | |
|---|---|---|---|
| 7,407,893 | B2 | 8/2008 | Seamons et al. |
| 7,679,133 | B2 | 3/2010 | Son et al. |
| 8,222,162 | B2 | 7/2012 | Okada et al. |
| 8,465,903 | B2 | 6/2013 | Weidman et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,901,016 | B2 | 12/2014 | Ha et al. |
| 8,962,101 | B2 | 2/2015 | Subramonium et al. |
| 2004/0000534 | A1 | 1/2004 | Lipinski |
| 2004/0119163 | A1* | 6/2004 | Wong ................ H01L 21/76807 257/758 |
| 2005/0214694 | A1* | 9/2005 | Hong .................. H01L 21/0273 430/323 |
| 2005/0287771 | A1 | 12/2005 | Seamons et al. |
| 2006/0078677 | A1* | 4/2006 | Won .......................... C23C 8/36 427/248.1 |
| 2007/0200179 | A1* | 8/2007 | Chen ............... H01L 21/823807 257/369 |
| 2008/0260968 | A1* | 10/2008 | Kim ........................ C23C 16/26 427/577 |
| 2008/0293248 | A1 | 11/2008 | Park et al. |
| 2009/0035584 | A1* | 2/2009 | Tran ................... H01L 21/0337 428/446 |
| 2011/0233648 | A1 | 9/2011 | Seol et al. |
| 2012/0183887 | A1 | 7/2012 | Iseki et al. |
| 2012/0258261 | A1 | 10/2012 | Reddy et al. |
| 2014/0213062 | A1* | 7/2014 | Shimizu ............. H01L 21/0332 438/719 |
| 2014/0356764 | A1* | 12/2014 | Iseki ................... H01M 8/0206 429/518 |
| 2016/0049305 | A1* | 2/2016 | Mebarki ............. H01L 21/3088 438/700 |

FOREIGN PATENT DOCUMENTS

| | | |
|---|---|---|
| JP | 2012-142574 A | 7/2012 |
| KR | 10-0765806 B1 | 10/2007 |
| KR | 10-2009-0057533 A | 6/2009 |
| KR | 10-2010-0112070 A | 2/2010 |
| KR | 10-2014-0009169 A | 6/2013 |
| KR | 10-1326704 B1 | 11/2013 |
| KR | 10-1408063 B1 | 6/2014 |

OTHER PUBLICATIONS

Zeev Shpilman et al., "Oxidation and Etching of CVD Diamond by Thermal and Hyperthermal Atomic Oxygen," J. Phys. Chem. C 2010, 114, pp. 18996-19003.

* cited by examiner

METHODS OF FORMING A HARD MASK LAYER AND OF FABRICATING A SEMICONDUCTOR DEVICE USING THE SAME

PRIORITY STATEMENT

This U.S. non-provisional patent application claims priority under 35 U.S.C. §119 to Korean Patent Application No. 10-2014-0132455, filed on Oct. 1, 2014, in the Korean Intellectual Property Office, the entire contents of which are hereby incorporated by reference.

BACKGROUND

Exemplary embodiments of the inventive concept relate to methods of forming a hard mask layer and to methods of fabricating a semiconductor device using a hard mask. In particular, exemplary embodiments of the inventive concept relate to a method of forming a recess with a high aspect ratio in the fabricating of a semiconductor device.

Due to their small size, multi-functionality, and/or low-cost characteristics, semiconductor devices are considered important elements in the electronics industry. Semiconductor devices can be generally classified into memory devices for storing data, logic devices for processing data, and hybrid devices capable of performing various functions.

There is an increasing demand for a semiconductor device with a higher integration density and higher performance. Although a variety of studies are being conducted to meet such a demand, it is necessary to reduce a process margin (for example, in a photolithography process) and this may lead to several difficulties in fabricating a semiconductor device.

SUMMARY

An embodiment of a method of forming a hard mask layer according to the inventive concept comprises providing a substrate, and introducing a source of carbon and nitrous oxide ($N_2O$) to the substrate under a plasma ambient of an inert gas to form an amorphous layer of carbon on the substrate, wherein the amorphous carbon layer is formed under conditions such that is has a nitrogen content ranging from 0.05 at % to 30 at % and an oxygen content ranging from 0.05 at % to 10 at %.

An embodiment of a method of fabricating a semiconductor device according to the inventive concept comprises forming an etch-target layer on a substrate, forming a hard mask pattern on the etch-target layer, and etching the etch-target layer using the hard mask pattern as an etch mask to form a recessed region in which an opening extends vertically in the etch-target layer from an upper surface of the etch-target layer, and in which the forming of the hard mask pattern comprises introducing a source of carbon and nitrous oxide ($N_2O$) onto the etch-target layer under a plasma ambient of an inert gas to form an amorphous carbon layer on the etch-target layer such the amorphous carbon layer has a nitrogen content ranging from 0.05 at % to 30 at % and an oxygen content ranging from 0.05 at % to 10 at %.

An embodiment of a method in the fabricating of a semiconductor device according to the inventive concept comprises supporting a substrate in a process chamber, producing in the process chamber a plasma of inert gas in the ambient environment of the substrate, and forming an amorphous layer of carbon on the substrate including by introducing a source of carbon, and nitrous oxide ($N_2O$) to the substrate through the ambient environment of the substrate comprising the plasma of inert gas such that the layer contains nitrogen in an atomic percentage substantially in a range of 0.05 at % to 30 at % and oxygen in an atomic percentage substantially in a range 0.05 at % to 10 at %.

BRIEF DESCRIPTION OF THE DRAWINGS

Exemplary embodiments will be more clearly understood from the following detailed description taken in conjunction with the accompanying drawings. The accompanying drawings illustrate non-limiting, exemplary embodiments as described hereinafter.

Figure 1:
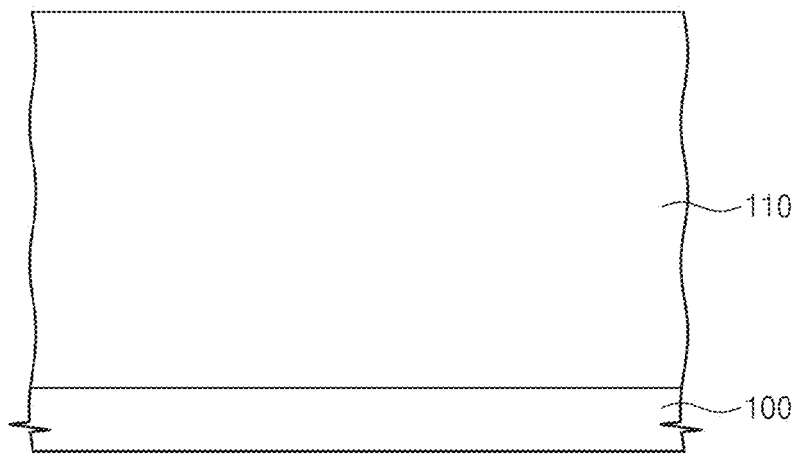
FIGS. 1, 2, 3, 4 and 5 are sectional views of a semiconductor device during the course of its fabrication, and together illustrate a method of forming an opening using a hard mask in the fabricating of a semiconductor device according to the inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate similar or identical elements or features.

DETAILED DESCRIPTION

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. The term "substantially" will be understood to encompass slight variations from desired results due to inherent fluctuations in the particular processing techniques used to produce those results. Thus, it may be seen that the end points of the ranges (e.g., ranges for atomic percentages, ratios of flow rates, etch selectivity, aspect ratio, temperature, pressure, etc.) throughout the detailed description are approximate.

Exemplary embodiments of the inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 5 schematically illustrate a method of forming a hard mask layer and of forming a recess using the same in the fabricating of a semiconductor device, according to the inventive concept.

Referring to FIG. 1, an etch-target layer 110 may be formed on a substrate 100. The substrate 100 may be a semiconductor substrate (e.g., of silicon, germanium, or silicon-germanium) or a compound semiconductor substrate. The etch-target layer 110 may include at least one of silicon, silicon oxide, silicon nitride, and silicon oxynitride.

Figure 2:
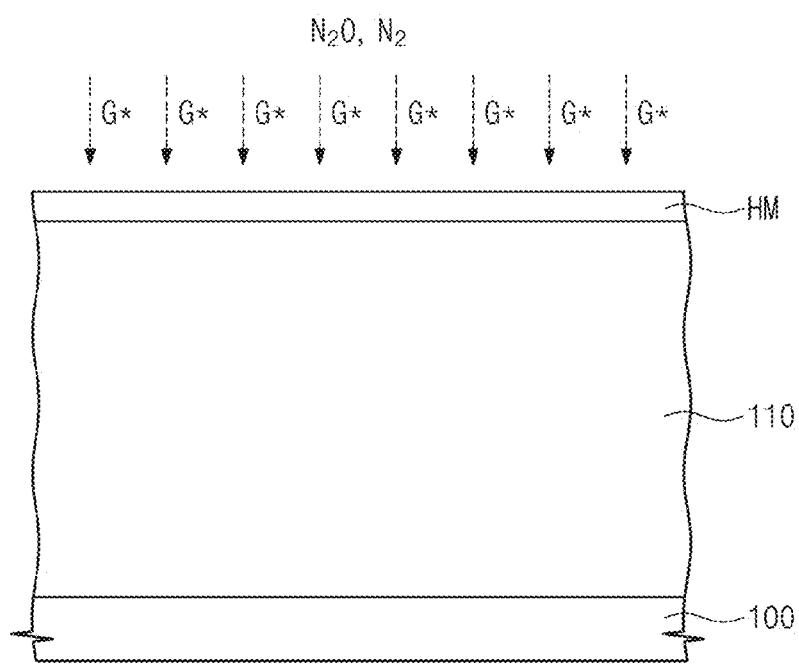

Referring to FIG. 2, a hard mask layer HM may be formed on the etch-target layer 110. The hard mask layer HM may include an amorphous carbon layer. For example, plasma G* of the inert gas may be generated in a process chamber by supplying an inert gas into the chamber, in which the substrate 100 is situated (supported). The inert gas may include at least one inert gas selected from the group consisting of helium (He), neon (Ne), argon (Ar), krypton (Kr), xenon (Xe), and radon (Rn).

The plasma treatment may be performed under a pressure ranging from 2 Torr to 100 Torr and at a temperature ranging from 200° C. to 600° C. The plasma G* may be generated using one of direct plasma, remote plasma, radiofrequency (RF) plasma, microwave plasma, inductively-coupled plasma, capacitively-coupled plasma, and electron cyclotron resonance plasma technologies. Apparatus including process chambers for such plasma generation technologies are known, per se, and as such will not be described herein further detail.

A carbon source and nitrous oxide ($N_2O$) may be supplied into the chamber. In certain embodiments, nitrogen ($N_2$) may be additionally supplied into the chamber. For example, a mixture of the nitrous oxide ($N_2O$) and the nitrogen ($N_2$), along with the carbon source, may be supplied into the chamber. The nitrous oxide ($N_2O$) and/or the nitrogen ($N_2$)

may be used to generated the plasma G*, in conjunction with the inert gas. Under the ambient of plasma G* of the supplied gas, the carbon source may be deposited on the etch-target layer 110 to form an amorphous carbon layer.

The binding energy between atoms constituting molecules of nitrous oxide ($N_2O$) is relatively low. Therefore, the nitrous oxide ($N_2O$) may be easily excited under the ambient of plasma G*. Accordingly, active species including various ions may be formed. The amorphous carbon layer may consist of carbon atoms bonded to each other, but C—C bonds with a relatively low binding energy may exist in the amorphous carbon layer. The active species may contribute to decompose the C—C bonds and thereby form CO or $CO_2$. In other words, when the amorphous carbon layer is deposited, the C—C bonds with a relatively low binding energy therein may be removed by the nitrous oxide ($N_2O$). Accordingly, the amorphous carbon layer can be formed of C—C bonds with higher binding energy, and this makes it possible to improve film uniformity of the amorphous carbon layer.

In addition to the nitrous oxide ($N_2O$) and the nitrogen ($N_2$), diborane ($B_2H_6$), boron trifluoride ($BF_3$), oxygen ($O_2$), or any mixture thereof may be additionally supplied into the chamber. The supply of the gases may allow the amorphous carbon layer to have higher film uniformity.

In exemplary embodiments, the nitrous oxide ($N_2O$) may be supplied into the chamber at a flow rate ranging from 10 sccm to 1000 sccm. If the flow rate is less than 10 sccm, the film of the amorphous carbon layer may be not sufficiently uniform. If the flow rate is higher than 1000 sccm, an excess amount of the active species may be generated. In this case, an excess number of the C—C bonds of the amorphous carbon layer may be decomposed so much so that the hard mask layer HM may not be sufficiently formed.

The flow rate of the nitrogen ($N_2$) supplied into the chamber may be 0.1 to 10 (i.e., 10% to 1,000%) times the flow rate of the nitrous oxide ($N_2O$) supplied into the chamber. The flow ratios of the nitrogen ($N_2$) to nitrous oxide ($N_2O$) within this range are met with respect to the gases being under the same temperature and the same pressure. The flow rate of each of the diborane ($B_2H_6$), boron trifluoride ($BF_3$), and oxygen ($O_2$) supplied into the chamber may range from 10 sccm to 5000 sccm.

In exemplary embodiments, the deposition of the amorphous carbon layer may be performed using a chemical vapor deposition process technique, such as a plasma-enhanced chemical vapor deposition (PE-CVD) or inductively-coupled plasma high-density plasma (ICP-HDP) deposition technique. In this regard, the carbon source to be supplied into the chamber may be at least one hydrocarbon selected from a group including C2-C6 alkanes, C2-C6 alkenes, and C2-C6 alkynes. For example, the carbon source may comprise $CH_4$, $C_2H_2$, $C_3H_6$, $C_6H_6$, $C_6H_{12}$, or $C_6H_{14}$, or mixtures thereof. The nitrous oxide ($N_2O$) may be supplied at a flow rate that is 0.01 to 2 (i.e., 1% to 200%) times that of the carbon source. As described above, if the flow rate of the nitrous oxide ($N_2O$) is more than twice that of the carbon source, an excessive number of the C—C bonds in the amorphous carbon layer may be decomposed. If the flow rate of the nitrous oxide ($N_2O$) is less than 0.01 times that of the carbon source, the film uniformity of the amorphous carbon layer may not be sufficiently uniform. The flow ratios of the nitrous oxide ($N_2O$) and the carbon source within this range when the nitrous oxide ($N_2O$) and the carbon source are introduced under the same temperature and the same pressure.

In other embodiments, the deposition of the amorphous carbon layer may be performed using a physical vapor deposition process, such as a sputtering or filtered vacuum arc technique. In these embodiments, the carbon source may comprise graphite.

According to the above-described method of forming the hard mask layer HM, the hard mask layer HM contains nitrogen (N) and oxygen (O) atoms, originated from nitrous oxide ($N_2O$). In exemplary embodiments, the hard mask layer HM has a nitrogen content ranging from 0.05 atomic percent (at %) to 30 at % and an oxygen content ranging from 0.05 at % to 10 at %. As an example, both nitrous oxide ($N_2O$) and nitrogen ($N_2$) are used to form a hard mask layer HM, such that the content or atomic percent of nitrogen atoms is higher than that of oxygen atoms in the hard mask layer HM.

Figure 3:
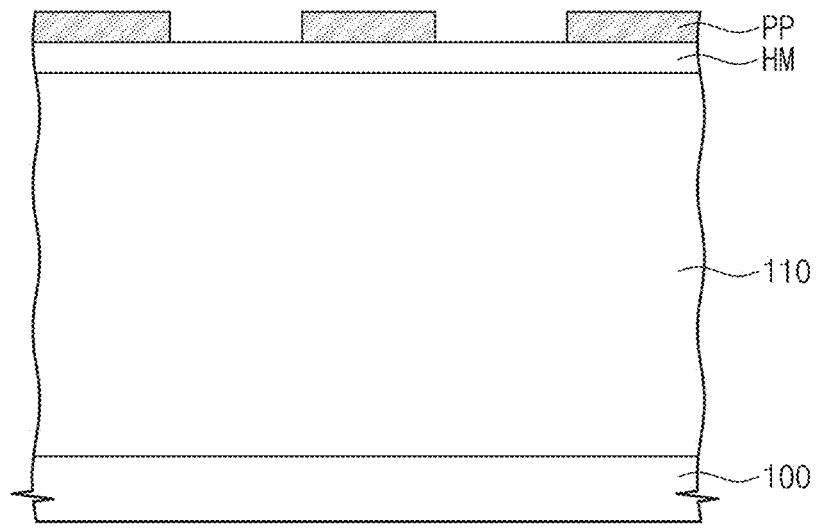

Referring to FIG. 3, a photoresist pattern PP may be formed on the hard mask layer HM. For example, a photoresist layer (not shown) is formed on the hard mask layer HM and the photoresist layer is exposed and then developed.

Figure 4:
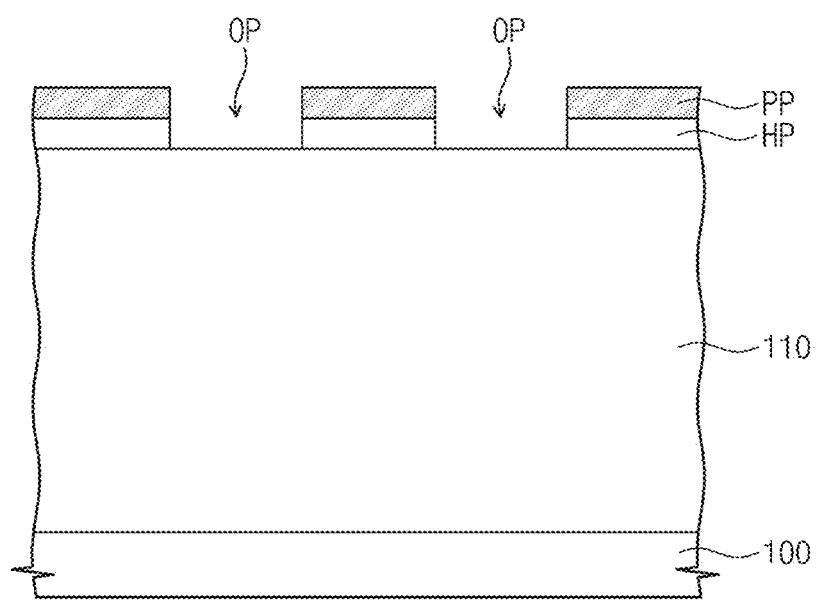

Referring to FIG. 4, the hard mask layer HM may be etched using the photoresist pattern PP as an etch mask to form a hard mask pattern HP. The hard mask pattern HP may define openings OP exposing part of a top surface of the etch-target layer 110. The openings OP may define to-be-etched regions on the etch-target layer 110. In other words, portions of the etch-target layer 110 exposed by the openings OP will be etched in a subsequent etching process. Although not shown, when viewed in plan view, each of the openings OP may be circular or linear (i.e., elongated in a specific direction).

Figure 5:
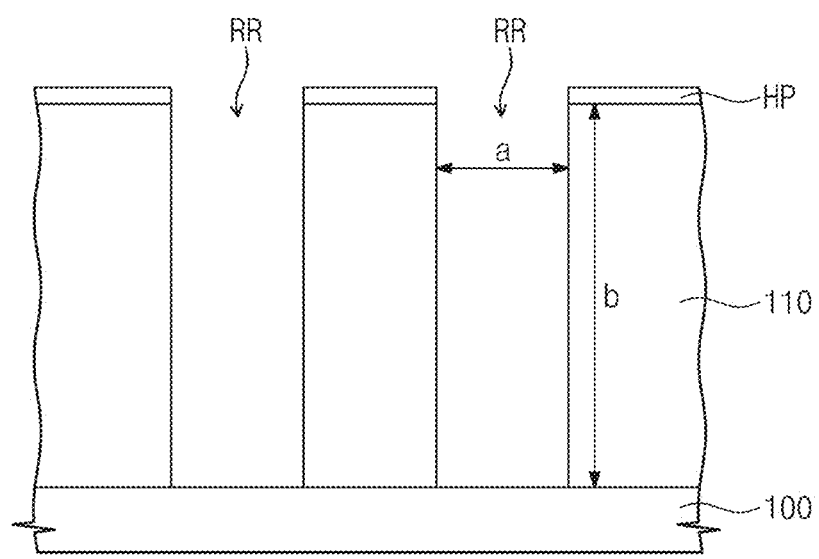

Referring to FIG. 5, the etch-target layer 110 may be etched using the hard mask pattern HP as an etch mask to form recess regions RR (regions of the etch-target layer 110 having openings, respectively, therein or therethrough). The photoresist pattern PP may be removed before or during the etching of the etch-target layer 110. The etching of the etch-target layer 110 may be performed using a dry etching process, and an etching gas to be used in the dry etching process may be selected in consideration of the material of the etch-target layer 110. For example, the etching gas may be $CF_4$.

The hard mask pattern HP may also be partially etched during the etching of the etch-target layer 110 and thus, the hard mask pattern HP may be thinner after the etching of the etch-target layer 110. According to exemplary embodiments of the inventive concept, the hard mask pattern HP may be formed to have a high etch selectivity with respect to the etch-target layer 110. As an example, the hard mask pattern HP may have an etch selectivity ranging from 2 to 50 with respect to the etch-target layer 110. The etch selectivity may be the ratio of the remaining thickness of the hard mask pattern HP to that of the etch-target layer 110 in a case in which the etch-target layer 110 and the hard mask pattern HP having the same initial thicknesses are respectively etched but under the same etching condition (i.e., using the same etchant).

The openings of the recess regions RR may be formed to have a high aspect ratio. Here, aspect ratio refers to the ratio of the depth 'b' to width 'a' of the opening (i.e., b/a). In exemplary embodiments, each of the openings may have an aspect ratio ranging from 5 to 100.

In general, it is difficult to use an amorphous-carbon-based hard mask pattern in a process of forming an opening with a high aspect ratio due to low film uniformity and low etch selectivity with respect to an etch-target layer. In particular, according to conventional wisdom, a relatively thick hard mask must be used to form an opening with a high aspect ratio, and this is an obstacle to the forming of fine patterns. By contrast, according to exemplary embodiments of the inventive concept, the hard mask pattern HP is relatively thin but has relatively high film uniformity and etch selectivity. Thus, a hard mask pattern HP formed according to the inventive concept can in turn be used to form fine recess regions RR whose openings each have a high aspect ratio.

In exemplary embodiments, the openings of the recess regions RR may be holes. For example, the openings OP of FIG. 4 may have a circular cross section and in this case, each of the recess regions RR may include a hole in the form of a cylinder.

In other embodiments, the openings of the recess regions RR may be trenches extending in a direction parallel to a top surface of the substrate 100. For example, the openings OP of FIG. 4 may be elongated in a horizontal direction. In this case, each of the recess regions RR may include a trench extending in the direction parallel to the top surface of the substrate 100.

Figure 8A:
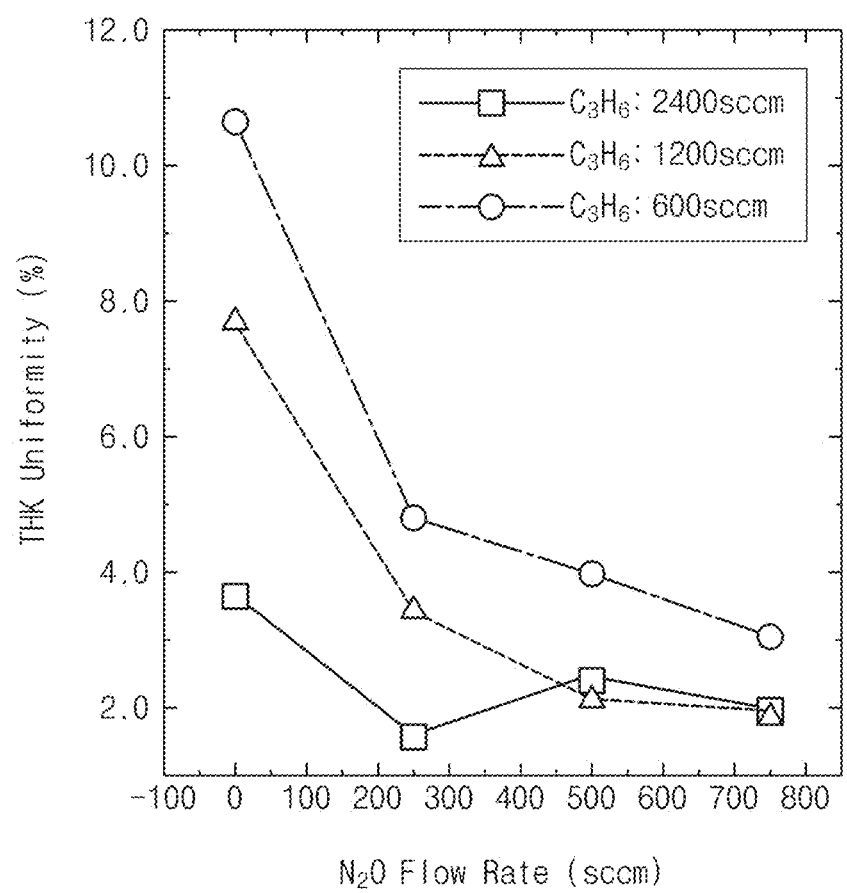
FIG. 8A is a graph showing a variation in thickness uniformity of hard mask layers formed according to the inventive concept, with changes in flow rate of nitrous oxide ($N_2O$).

FIG. 8A is a graph showing variations in thickness uniformity of hard mask layers formed according to the inventive concept, with respect to changes in flow rate of nitrous oxide ($N_2O$).

More specifically, FIG. 8A shows thickness uniformity of hard mask layers that were formed using a plasma-enhanced chemical vapor deposition (PE-CVD) process, in which $C_3H_6$ was used as the carbon source and helium (He) and argon (Ar) were used as the inert gas. Hard masks were formed with the carbon source being supplied at three different flow rates of 600 sccm, 1200 sccm, and 2400 sccm, respectively, and in each case the flow rate of the nitrous oxide ($N_2O$) was changed from 0 sccm to 800 sccm. As illustrated in FIG. 8A, an increase in flow rate of nitrous oxide ($N_2O$) led to improvement in thickness uniformity of the deposited hard mask layer in each case. That is, FIG. 8A shows that the use of nitrous oxide ($N_2O$) contributes to improved film uniformity of the hard mask layer.

Figure 8B:
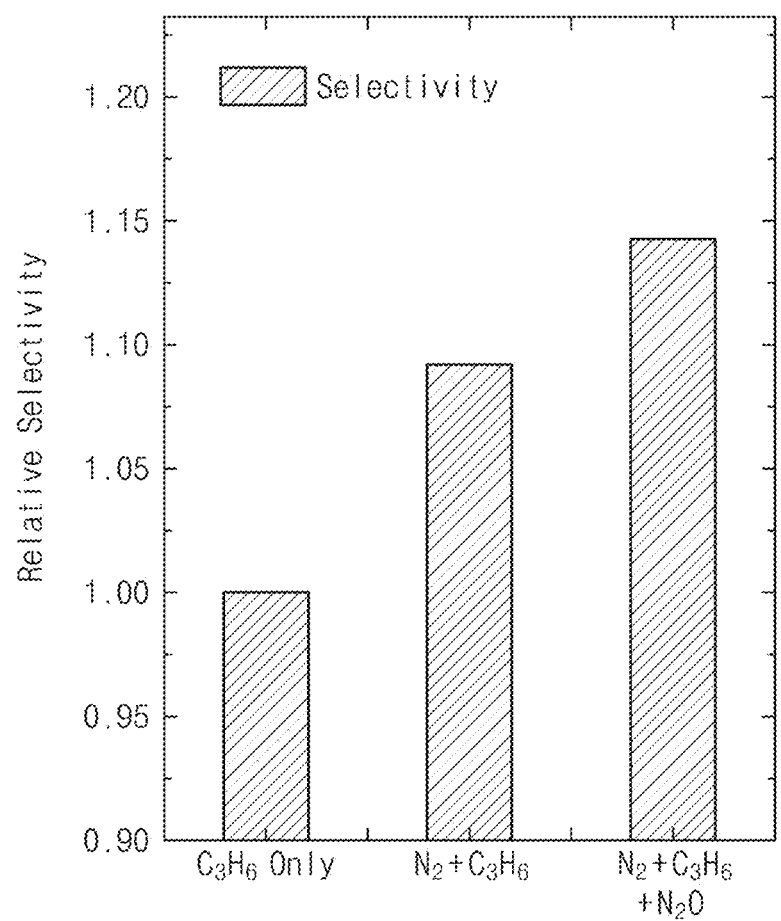
FIG. 8B is a graph showing etch selectivity with respect to the kind of process gas used in a method of forming a hard mask layer according to the inventive concept and in other methods for comparison.

FIG. 8B shows etch selectivity of hard mask layers that were each formed using a PE-CVD process. In a first comparative example, during the PE-CVD process, $C_3H_6$ was used as a carbon source and helium (He) and argon (Ar) were used as inert gas. In a second comparative example, in addition to $C_3H_6$ and the inert gas, nitrogen ($N_2$) was also supplied into the process chamber during the PE-CVD process. In an example according to the inventive concept, in addition to $C_3H_6$ and the inert gas, a mixture of nitrous oxide ($N_2O$) and nitrogen ($N_2$) was also supplied into the chamber during the PE-CVD process at flow rates of 250 sccm and 400 sccm, respectively. As illustrated in FIG. 8B, the hard mask layer fabricated according to an example of the present embodiment had an etch selectivity higher than those of the first and second comparative examples. In particular, the hard mask layer fabricated according to the inventive concept had an etch selectivity that was about 15%, greater than that of the hard mask layer fabricated according to the first comparative example.

In sum, film uniformity and etch selectivity are improved in a method according to the inventive concept in which nitrous oxide ($N_2O$) or a mixture gas of nitrous oxide ($N_2O$) and nitrogen ($N_2$) is used to form a hard mask layer. Accordingly, a hole or a trench with a high aspect ratio can be formed in an etch-target layer.

As will be clear from the descriptions below, the forming of a hard mask layer according to the inventive concept may be applied to the fabricating of a variety of semiconductor memory devices.

[Application to Dram Devices]

FIGS. 6A through 6H illustrate a method of fabricating a DRAM semiconductor device according to the inventive concept.

Figure 6A:
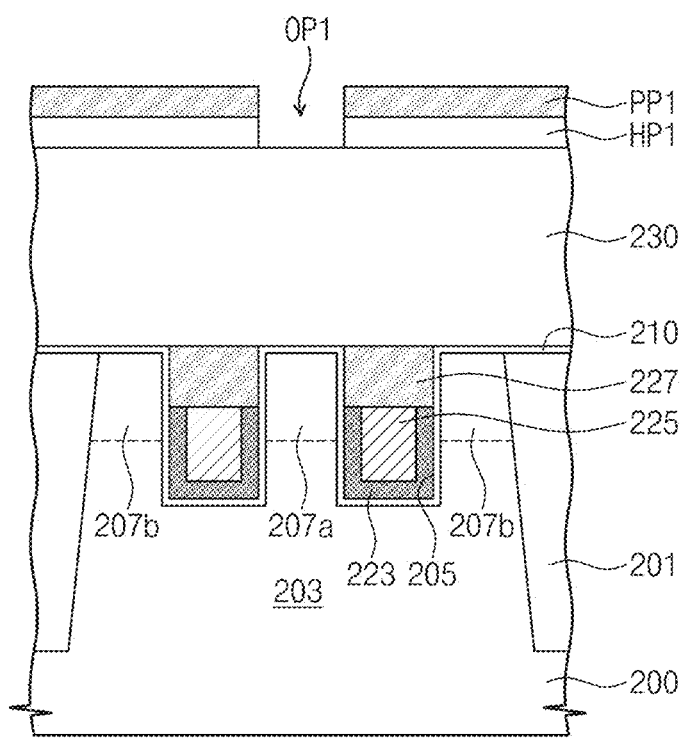
FIGS. 6A, 6B, 6C, 6D, 6E, 6F, 6G and 6H are sectional views of a semiconductor device during the course of its fabrication, and together illustrate one embodiment of a method of fabricating a semiconductor device according to the inventive concept.

Referring to FIG. 6A, a substrate 200 may be provided, and a device isolation pattern 201 may be provided on the substrate 200 to define an active pattern 203. The device isolation pattern 201 may be formed of or include an insulating material. As an example, the device isolation pattern 201 may include at least one of an oxide, nitride, and oxynitride. The substrate 200 may comprise a semiconductor material. For example, the substrate 200 may comprise at least one of silicon or germanium.

A trench 205 may be formed in the substrate 200. Although not shown, when viewed in plan view, the trench 205 is elongated in a specific direction or extends linearly across the active pattern 203 and the device isolation pattern 201. In exemplary embodiments, a plurality of trenches 205 may be formed in the substrate 200. For example, a pair of trenches 205 may be formed across the active pattern 203.

Gate electrodes may be formed in the trenches 205, respectively. Each gate electrode may include a bulk gate pattern 225 and a liner gate pattern 223. The bulk gate pattern 225 may be formed within the trench 205. The liner gate pattern 223 may be formed before the bulk gate pattern 225 so as to be interposed between the bulk gate pattern 225 and the substrate 200. The liner gate pattern 223 and the bulk gate pattern 225 may include at least one of doped semiconductors, conductive metal nitrides (e.g., titanium nitride, tantalum nitride, tungsten nitride, etc.), and metals (e.g., ruthenium, iridium, titanium, tungsten, tantalum, etc.) In certain embodiments, the bulk gate pattern 225 and the liner gate pattern 223 may be formed of conductive materials different from each other. For example, the bulk gate pattern 225 may comprise tungsten, and the liner gate pattern 223 may comprise titanium nitride.

A gate dielectric layer 210 may be formed on the substrate 200 before the liner gate pattern 223 so as to be disposed in the trench between the substrate 200 and the liner gate pattern 223. The gate dielectric layer 210 may cover an inner surface of the substrate 200 delimiting the trench and a top surface of the substrate 200. The gate dielectric layer 210 may include at least one of high-k dielectric materials, oxides, nitrides, and oxynitrides. The high-k dielectric materials may be those insulating materials whose dielectric constants are higher than that of silicon nitride (e.g., hafnium oxide and aluminum oxide). For example, the gate dielectric layer 210 may comprise at least one insulating metal oxide.

A capping pattern 227 may be formed in each of the trenches 205 and on the gate electrode. The capping pattern 227 may be formed to cover a top surface of the gate electrode. The capping pattern 227 may include an insulating material. For example, the capping pattern 227 may be formed of or include at least one of an oxide, nitride, and oxynitride.

Impurity regions 207a and 207b may be formed in portions of the active pattern 203 located at both sides of each the trenches 205 as adjacent to the trenches 205. As an example, a first impurity region 207a and a pair of second impurity regions 207b may be formed in the active pattern 203. The first impurity region 207a may be formed in a portion of the active pattern 203 interposed between a pair of the gate electrodes. The pair of the second impurity regions 207b may be formed in other portions of the active pattern 203 such that a pair of gate electrodes and the first impurity region 207a are interposed between the second impurity regions 207b. The first impurity region 207a may have a first conductivity type, and the pair of the second impurity regions 207b may have a second conductivity type different from the first conductivity type.

The impurity regions 207a and 207b may have bottom surfaces lower than a top surface of the active pattern 203. The impurity regions 207a and 207b may have sides coinciding with surfaces defining sides of the trenches 205. The impurity regions 207a and 207b may be formed by a process of injecting impurities into the active pattern 203. As an example, the impurity regions 207a and 207b may be formed in such a way that the bottoms thereof are located at a higher level than the bottoms of the trenches 205.

A first interlayer insulating layer 230 may be formed on the substrate 200. In exemplary embodiments, the first interlayer insulating layer 230 may be used as a first etch-target layer. The first interlayer insulating layer 230 may be formed by a physical vapor deposition process (PVD), a chemical vapor deposition process (CVD), or an atomic layer deposition process (ALD). The first interlayer insulating layer 230 may comprise at least one of n oxide, nitride, and oxynitride.

A first hard mask pattern HP1 and a first photoresist pattern PP1 may be formed on the first interlayer insulating layer 230. The first hard mask pattern HP1 and the first photoresist pattern PP1 may be formed using the same method as that for forming the hard mask pattern HP and the photoresist pattern PP described with reference to FIGS. 1 through 4.

The first hard mask pattern HP1 may be formed to define a first opening OP1 partially exposing a top surface of the first interlayer insulating layer 230. When viewed in plan, the first opening OP1 may be circular and may overlie the first impurity region 207a.

Figure 6B:
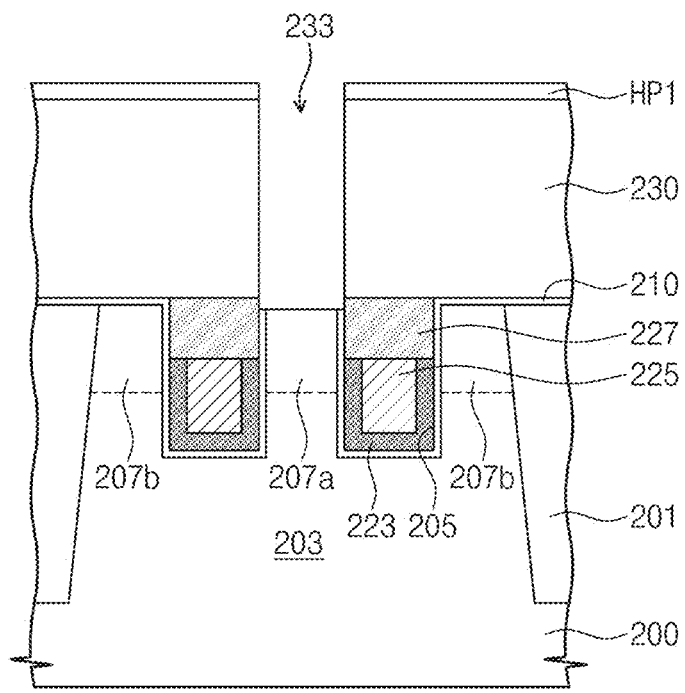

Referring to FIG. 6B, a first hole 233 may be formed through the first interlayer insulating layer 230 to expose the first impurity region 207a. The first hole 233 may be formed by etching the first interlayer insulating layer 230 using the first hard mask pattern HP1 as an etch mask. The first hole 233 may be formed in substantially the same manner as that used to form a recess region RR as described with reference to FIG. 5. After the formation of the first hole 233, a remaining portion of the first hard mask pattern HP1 may be removed.

According to exemplary embodiments of the inventive concept, the first hard mask pattern HP1 may have a high etch selectivity with respect to the first interlayer insulating layer 230. The use of the first hard mask pattern HP1 may make it easy to form the first hole 233 with a high aspect ratio.

Figure 6C:
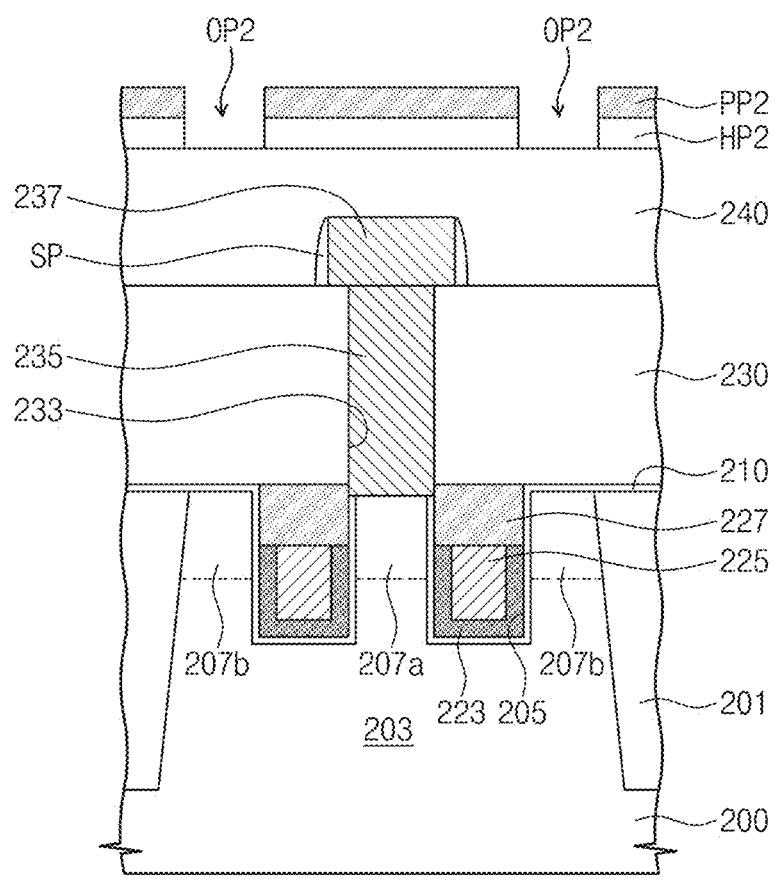

Referring to FIG. 6C, a first contact plug 235 may be formed in the first hole 233. The first contact plug 235 may include at least one of semiconductor materials (e.g., poly silicon), metal-semiconductor compounds (e.g., tungsten silicide), conductive metal nitrides (e.g., titanium nitride, tantalum nitride, and tungsten nitride), and metals (e.g., titanium, tungsten, and tantalum). As an example, the first contact plug 235 may be in contact with an inner side surface of the interlayer insulating layer 230 defining the first hole 233.

An interconnection line 237 may be formed on the first interlayer insulating layer 230 and may be electrically connected to the first contact plug 235. Although not shown, when viewed in plan, the interconnection line 237 may extend linearly across the trenches 205. In the DRAM device, the interconnection line 237 may serve as a bit line. The interconnection line 237 may include at least one of semiconductor materials (e.g., poly silicon), metal-semiconductor compounds (e.g., tungsten silicide), conductive metal nitrides (e.g., titanium nitride, tantalum nitride, and tungsten nitride), and metals (e.g., titanium, tungsten, and tantalum). The interconnection line 237 may be formed by first forming a conductive layer on the first interlayer insulating layer 230 and then patterning the conductive layer. Alternatively, the interconnection line 237 may be formed by a damascene process. In other words, the interconnection line 237 may be formed by forming an insulating layer on the first interlayer insulating layer 230 to have an opening and filling the opening with a conductive material. Spacers SP may be formed on both sidewalls of the interconnection line 237.

A second interlayer insulating layer 240 may be formed on the first interlayer insulating layer 230 to cover the interconnection line 237. The second interlayer insulating layer 240 may be a second etch-target layer. The second interlayer insulating layer 240 may be formed by a chemical vapor deposition process. The second interlayer insulating layer 240 may comprise at least one of an oxide, nitride, and oxynitride.

A second hard mask pattern HP2 and a second photoresist pattern PP2 may be formed on the second interlayer insulating layer 240. The second hard mask pattern HP2 and the second photoresist pattern PP2 may be formed by the same method of forming the hard mask pattern HP and the photoresist pattern PP previously described with reference to FIGS. 1 through 4.

The second hard mask pattern HP2 may be formed to have second openings OP2 partially exposing a top surface of the second interlayer insulating layer 240. When viewed in plan, the second openings OP2 may be circular and may overlie the second impurity regions 207b, respectively.

Figure 6D:
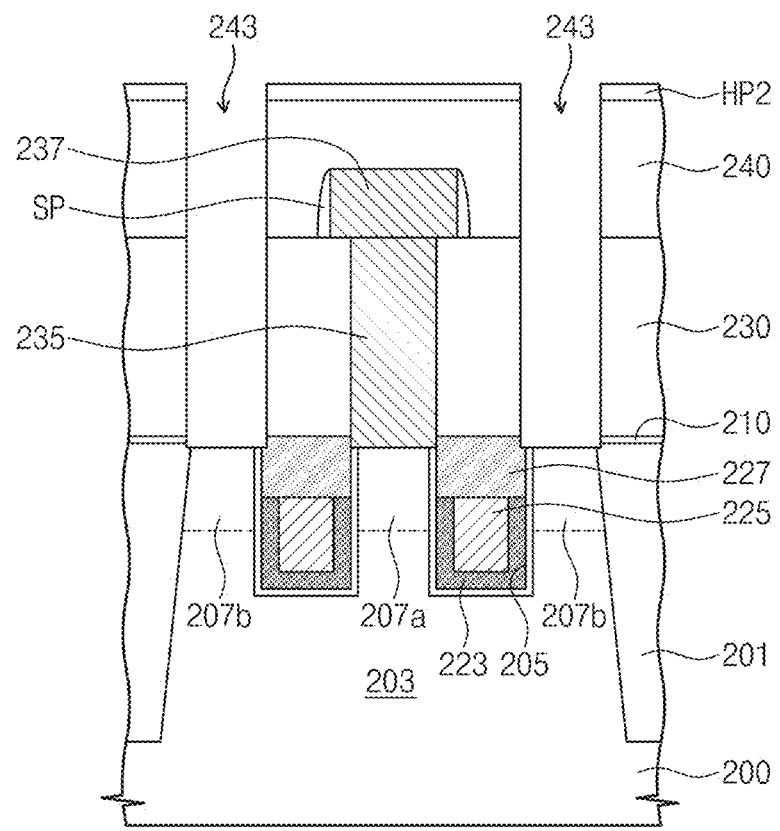

Referring to FIG. 6D, second holes 243 may be formed through the first and second interlayer insulating layers 230 and 240 to expose the second impurity regions 207b. The second holes 243 may be formed by etching the first and second interlayer insulating layers 230 and 240 using the second hard mask pattern HP2 as an etch mask. The second holes 243 may be formed in substantially the same manner as the forming of the recess regions RR previously described with reference to FIG. 5. After the second holes 243 have been formed, a remaining portion of the second hard mask pattern HP2 may be removed.

According to exemplary embodiments of the inventive concept, the second hard mask pattern HP2 may be formed to have a high etch selectivity with respect to the first and second interlayer insulating layers 230 and 240. The use of the second hard mask pattern HP2 may make it easy to form the second holes 243 with a high aspect ratio.

Figure 6E:
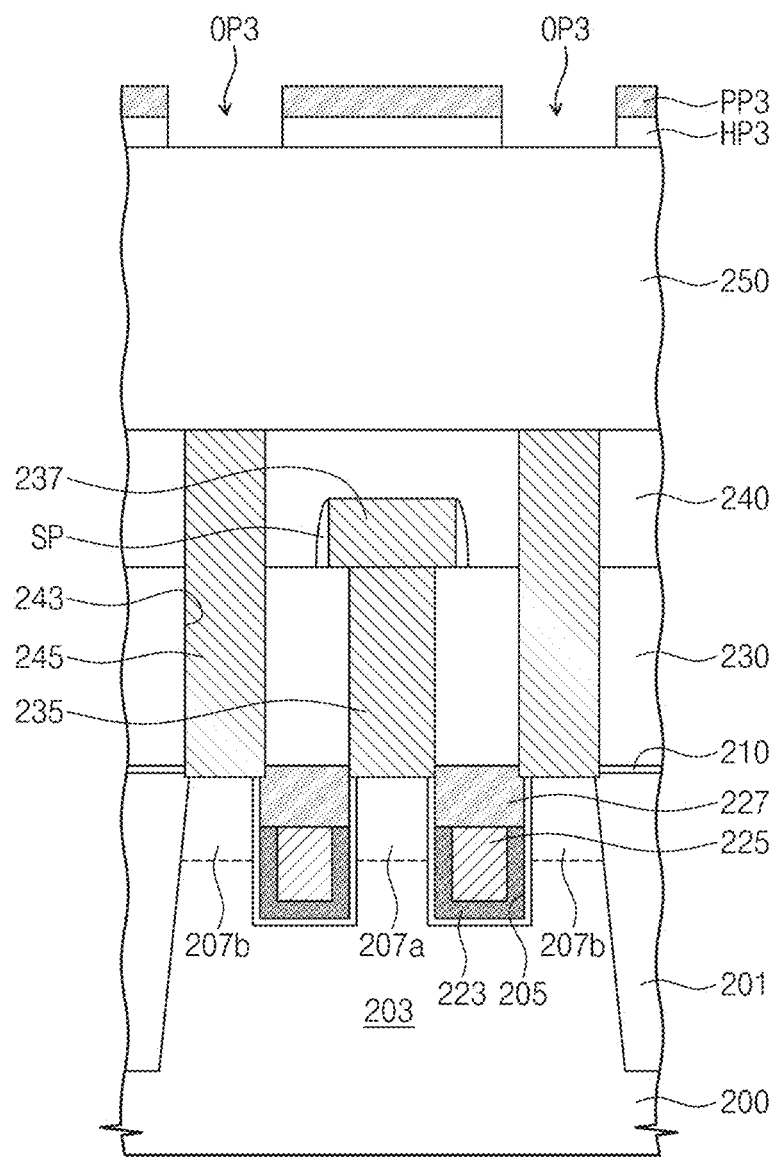

Referring to FIG. 6E, second contact plugs 245 may be formed in the second holes 243, respectively. The second contact plugs 245 may comprise at least one of semiconductor materials (e.g., poly silicon), metal-semiconductor compounds (e.g., tungsten silicide), conductive metal nitrides (e.g., titanium nitride, tantalum nitride, and tungsten nitride), and metals (e.g., titanium, tungsten, and tantalum). As an example, the second contact plugs 245 may be in contact with inner side surfaces of the first and second interlayer insulating layers 230 and 240 defining the second holes 243, respectively.

A sacrificial layer 250 may be formed on the second interlayer insulating layer 240. The sacrificial layer 250 may be a third etch-target layer. A third hard mask pattern HP3 and a third photoresist pattern PP3 may be formed on the sacrificial layer 250. The third hard mask pattern HP3 and the third photoresist pattern PP3 may be formed using the same method as that for forming the hard mask pattern HP and the photoresist pattern PP previously described with reference to FIGS. 1 through 4.

The third hard mask pattern HP3 may be formed to define third openings OP3, each of which exposes a portion of the top surface of the sacrificial layer 250. When viewed in plan, the third openings OP3 may be circular and may overlie the second contact plugs 245, respectively.

Figure 6F:
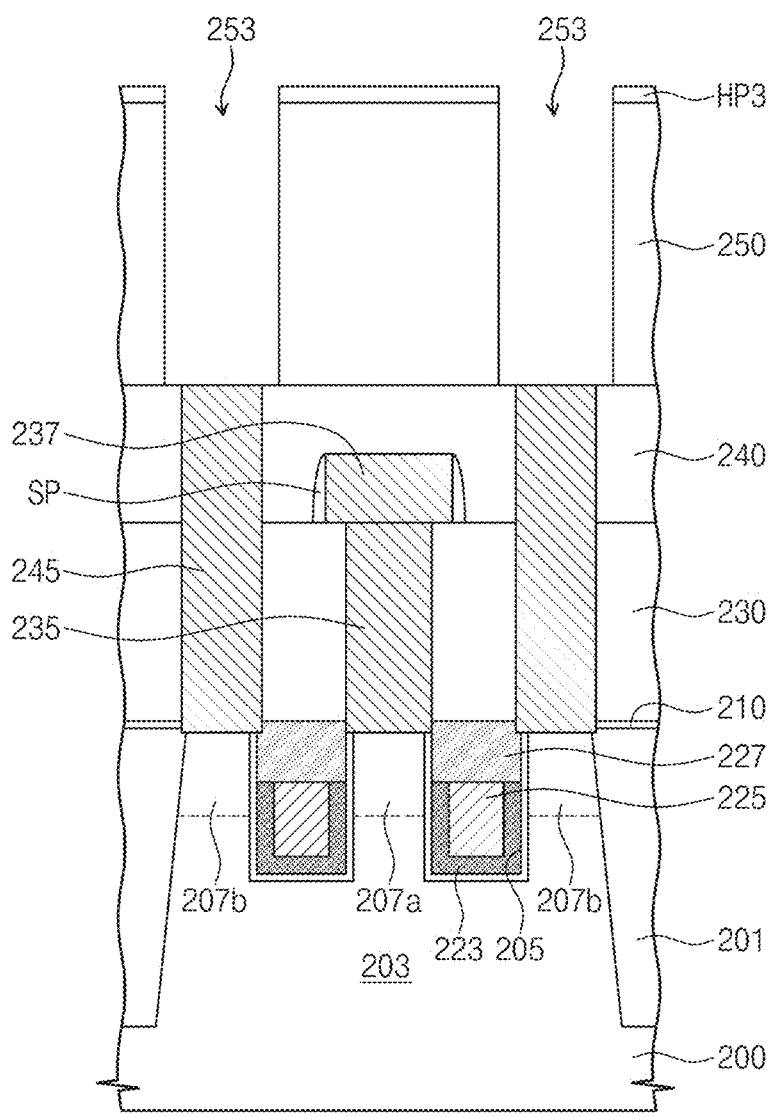

Referring to FIG. 6F, third holes 253 may be formed through the sacrificial layer 250 to expose the second contact plugs 245. The third holes 253 may be formed by etching the sacrificial layer 250 using the third hard mask pattern HP3 as an etch mask. The third holes 253 may be formed in the same manner as the forming of the recess regions RR previously described with reference to FIG. 5. After the third holes 253 have been formed, a remaining portion of the third hard mask pattern HP3 may be removed.

According to exemplary embodiments of the inventive concept, the third hard mask pattern HP3 may be formed to have a high etch selectivity with respect to the sacrificial layer 250. Accordingly, the use of the third hard mask pattern HP3 may make it easy to form the third holes 253 with a high aspect ratio.

Figure 6G:
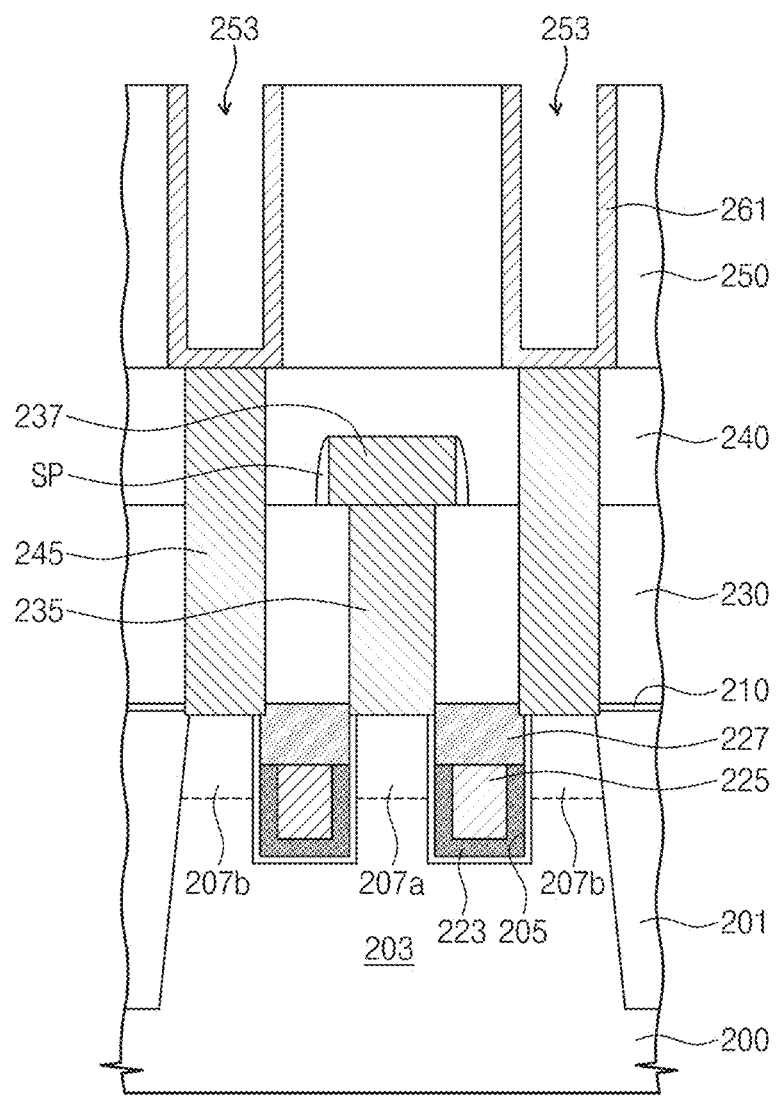

Referring to FIG. 6G, first electrodes 261 may be formed to conformally cover inner surfaces of the sacrificial layer 250 defining the third holes 253, respectively. As an example, each of the first electrodes 261 may be formed to be cylindrical. The first electrodes 261 may comprise a conductive material. For example, the first electrodes 261 may comprise at least one of doped semiconductors, conductive metal nitrides (e.g., titanium nitride, tantalum nitride, and tungsten nitride), metals (e.g., ruthenium, iridium, titanium, and tantalum), and conductive metal oxides (e.g., iridium oxide).

Figure 6H:
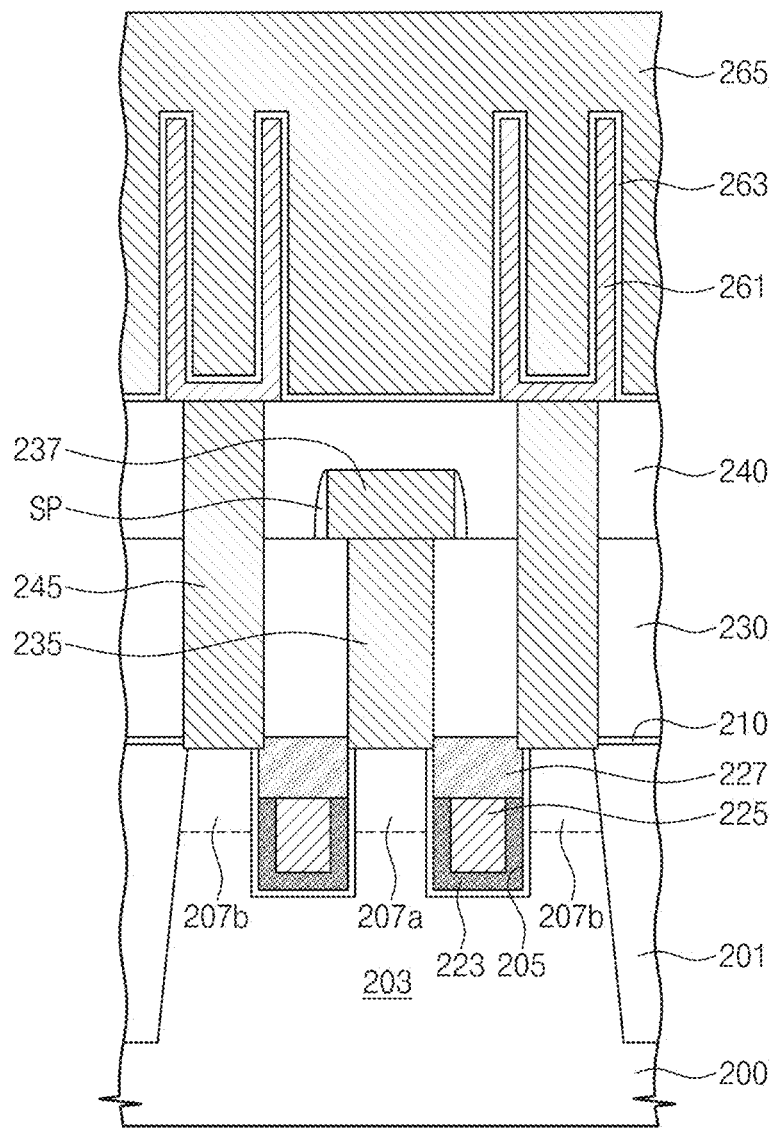

Referring to FIG. 6H, the sacrificial layer 250 may be removed, and a capacitor dielectric layer 263 may be conformally formed on the second interlayer insulating layer 240. The capacitor dielectric layer 263 may be formed to cover the entirety of the exposed surfaces of the first electrodes 261. The capacitor dielectric layer 263 may comprise at least one of an oxide, nitride, oxynitride, and high-k dielectric material.

A second electrode 265 may be formed on the second interlayer insulating layer 240 to cover the capacitor dielectric layer 263. The second electrode 265 may comprise a conductive material. For example, the second electrode 265 may comprise at least one of doped semiconductors, metals, conductive metal nitrides, and metal silicides.

The first electrodes 261, the capacitor dielectric layer 263, and the second electrode 265 may constitute a capacitor serving as a memory element of the DRAM device. As described above, by using the first to third hard mask patterns HP1, HP2, and HP3, it is possible to form the first to third holes 233, 243, and 253 with high aspect ratios, in an exact and efficient manner. Hence, the semiconductor device can be fabricated to have higher reliability and improved electric characteristics.

[Application to V-NAND Devices]

FIGS. 7A through 7H illustrate a method of fabricating a V-NAND semiconductor device according to the inventive concept.

Figure 7A:
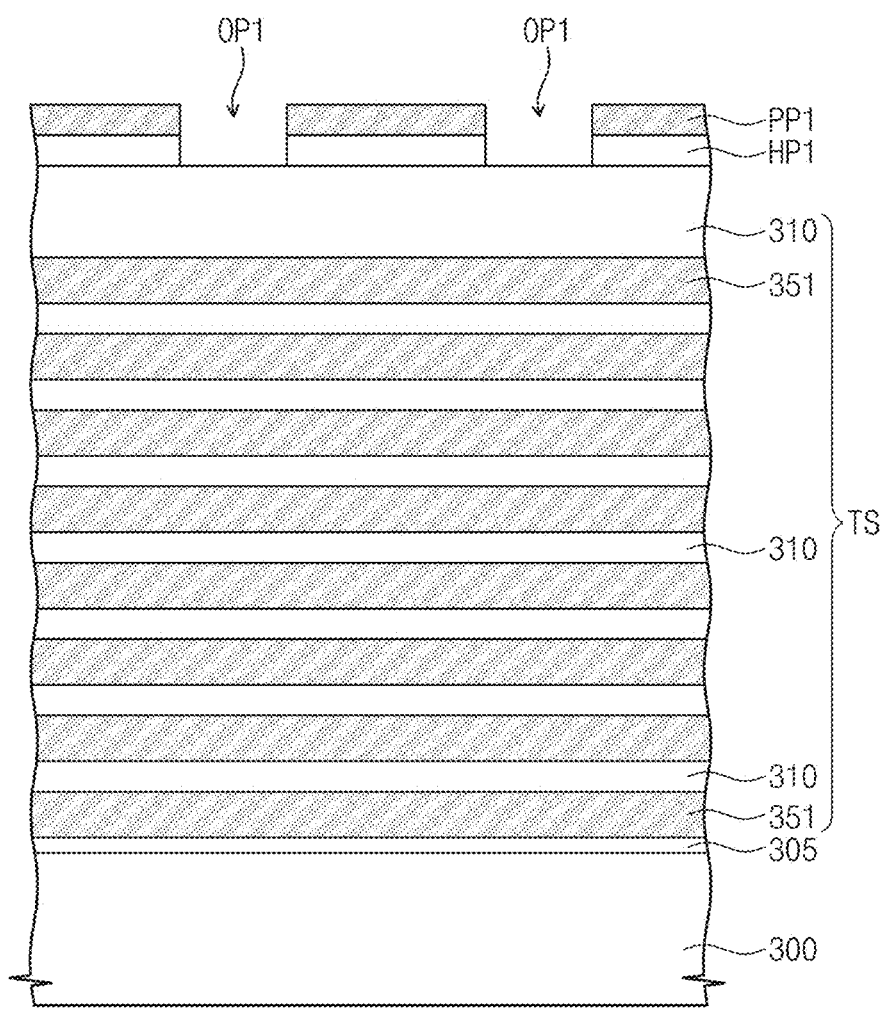
FIGS. 7A, 7B, 7C, 7D, 7E, 7F, 7G and 7H are sectional views of a semiconductor device during the course of its fabrication, and together illustrate another embodiment of a method of fabricating a semiconductor device according to the inventive concept.

Referring to FIG. 7A, sacrificial layers 351 and insulating layers 310 may be alternately and repeatedly formed on a substrate 300 to form a layered structure TS. The substrate 300 may be, for example, a silicon wafer, a germanium wafer, or a silicon-germanium wafer.

The sacrificial layers 351 may be formed of or include a material which can be etched with a high etch selectivity with respect to the insulating layers 310. An etch selectivity between the sacrificial layers 351 and the insulating layers 310 may be high in a wet etching process using etching chemicals and may be low in a dry etching process using etching gas.

In exemplary embodiments, the sacrificial layers 351 may be formed to the same thicknesses. In other exemplary embodiments, the uppermost and lowermost ones of the sacrificial layers 351 may be thicker than the others therebetween. The insulating layers 310 may be formed to the same thicknesses, but in certain embodiments, at least one of the insulating layers 310 may have a thickness different from those of the others.

The sacrificial layers 351 and the insulating layers 310 may be formed by, for example, a thermal CVD, plasma-enhanced CVD, physical CVD, or ALD process.

In exemplary embodiments, the sacrificial layers 351 and the insulating layers 310 may be formed of insulating materials which have an etch selectivity (i.e., different etch rates) with respect to a particular etchant. To this end, the sacrificial layers 351 may each be a silicon layer, a silicon oxide layer, a silicon carbide layer, a silicon oxynitride layer, or a silicon nitride layer. The insulating layers 310 may be formed of a material different from that of the sacrificial layers 351 and selected from the group consisting of a silicon layer, a silicon oxide layer, a silicon carbide layer, a silicon oxynitride layer, and a silicon nitride layer. For example, the sacrificial layers 351 may each be formed of a silicon nitride layer, and the insulating layers 310 may each be formed of a silicon oxide layer. In other embodiments, the sacrificial layers 351 may be formed of a conductive material, and the insulating layers 310 may be formed of an insulating material.

A lower insulating layer 305 may be formed directly on the substrate 300 so as to be interposed between the substrate 300 and the layered structure TS. For example, the lower insulating layer 305 may be a silicon oxide layer, which may be formed by a thermal oxidation process. Alternatively, the lower insulating layer 305 may be a silicon oxide layer, which may be formed by a deposition technique. The lower insulating layer 305 may be thinner than the sacrificial layers 351 and the insulating layers 310 thereon.

A first hard mask pattern HP1 and a first photoresist pattern PP1 may be formed on the layered structure TS. The first hard mask pattern HP1 and the first photoresist pattern PP1 may be formed using the same method as that for forming the hard mask pattern HP and the photoresist pattern PP previously described with reference to FIGS. 1 through 4.

The first hard mask pattern HP1 may be formed to define a first openings OP1 partially exposing, for example, the uppermost one of the insulating layers 310. When viewed in plan, the first openings OP1 may be circular. Although not shown, when viewed in plan, the first openings OP1 may be formed to have a zigzag arrangement on the substrate 300.

Figure 7B:
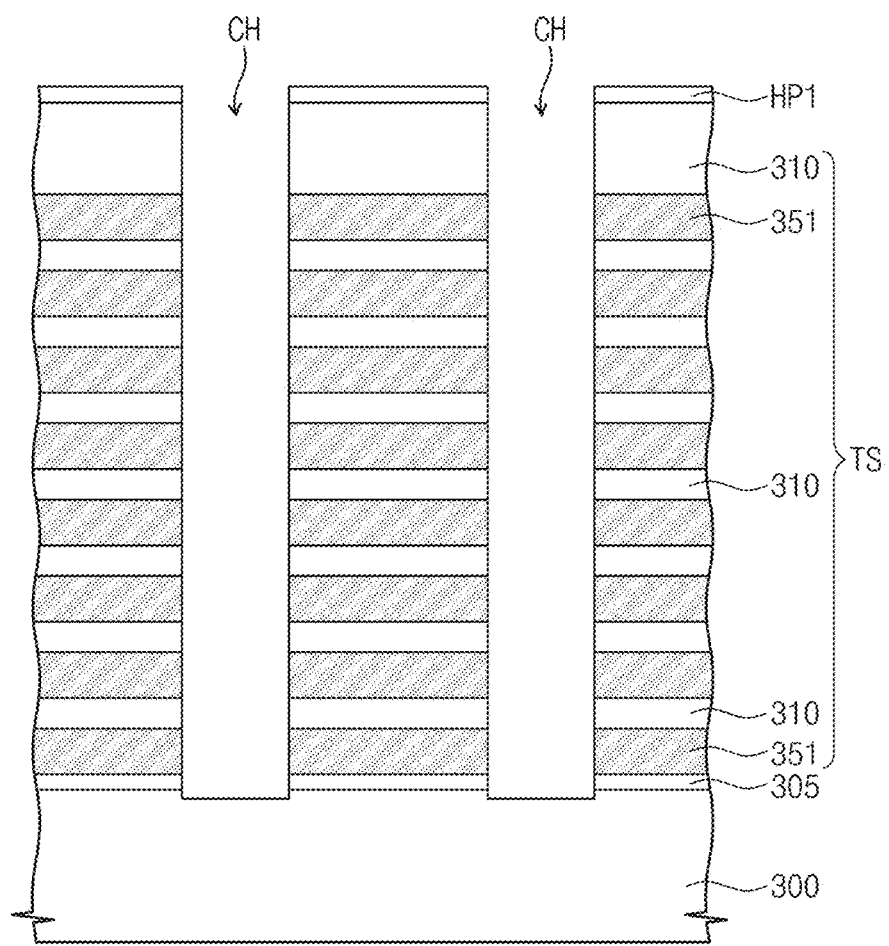

Referring to FIG. 7B, channel holes CH may be formed through the layered structure TS to expose the substrate 300. Although not shown, when viewed in plan, the channel holes CH may be formed to have a zigzag arrangement (for example, the same arrangement as the first openings OP1).

The channel holes CH may be formed by etching the sacrificial layers 351 and the insulating layers 310 using the first hard mask pattern HP1 as an etch mask. The channel holes CH may be formed in substantially the same manner as the forming of the recess regions RR previously described with reference to FIG. 5. During the etching process, a top surface of the substrate 300 may be over-etched, and in this case, a recess may be formed in the top of the substrate 300. After the channel holes CH have been formed, a remaining portion of the first hard mask pattern HP1 may be removed.

Figure 7C:
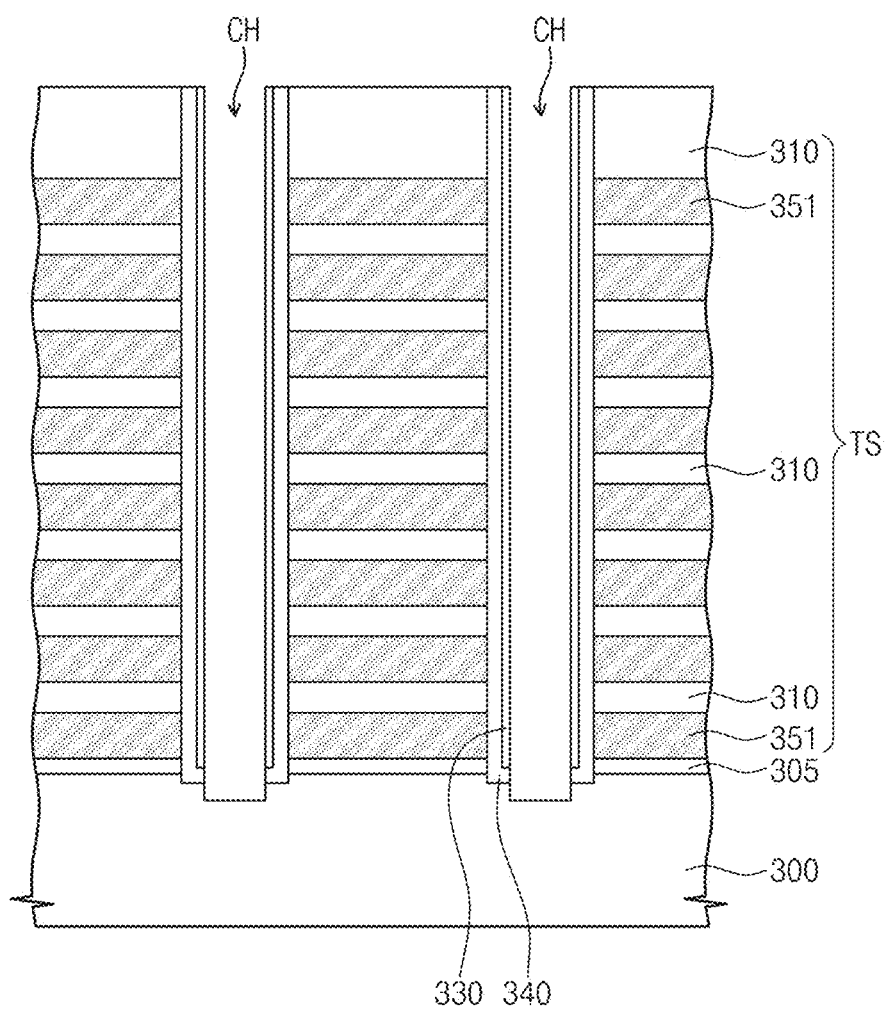

Referring to FIG. 7C, vertical insulating materials 340 and vertical semiconductor patterns 330 may be formed to cover inner surfaces defining sides of the channel holes CH while allowing a portion of the substrate 300 to remain exposed. For example, a vertical insulating layer (not shown) and a vertical semiconductor layer (not shown) may be sequentially formed on the structure provided with the channel holes CH. A sum of thicknesses of the vertical insulating and semiconductor layers may be smaller than half of a width of each of the channel holes CH. In other words, the channel holes CH may not be filled by the vertical insulating layer and the vertical semiconductor layer. Furthermore, the vertical insulating layer may be formed to cover the top surface of the substrate 300 exposed by the channel holes CH. The vertical insulating layer may include a plurality of thin films, which may each be formed by, for example, one of PE-CVD, physical CVD, and ALD processes.

The vertical insulating layer may include a charge storing layer (not shown) serving as a memory element for a FLASH memory device. The charge storing layer may be a trap insulating layer or an insulating layer with conductive nanodots. In certain embodiments, the vertical insulating layer may comprise at least one layer (not shown) exhibiting a phase-changeable or variable resistance property.

In exemplary embodiments, although not shown, the vertical insulating layer may include a blocking insulating layer (not shown), a charge storing layer (not shown), and a tunnel insulating layer (not shown), which are sequentially stacked. The blocking insulating layer may be formed to cover sidewalls of the sacrificial and insulating layers 351 and 310 and the top surface of the substrate 300, which are exposed by the channel holes CH. The blocking insulating layer may comprise at least one of silicon oxide or a high-k dielectric. The charge storing layer may comprise a trap insulating layer or an insulating layer with conductive nanodots. For example, the charge storing layer may comprise at least one of a silicon nitride layer, a silicon oxynitride layer, a silicon-rich nitride layer, a nanocrystalline silicon layer, and a laminated trap layer. The tunnel insulating layer may be formed of at least one insulating layer whose band gaps are greater than that of the charge storing layer. For example, the tunnel insulating layer may be a silicon oxide layer.

The vertical semiconductor layer may be formed on the vertical insulating layer. In exemplary embodiments, the vertical semiconductor layer may be formed by an ALD or CVD process and may be formed of a semiconductor material (e.g., may be a polysilicon layer, a single crystalline silicon layer, or an amorphous silicon layer).

After the sequential formation of the vertical insulating layer and the vertical semiconductor layer, the vertical semiconductor layer and the vertical insulating layer may be anisotropically etched to expose the substrate 300. Accordingly, the vertical insulating materials 340 and the vertical semiconductor patterns 330 may be formed along the sides of the channel holes CH. Each of the vertical insulating materials 340 and the vertical semiconductor patterns 330 may be formed to have a hollow cylindrical shape. In the case in which the anisotropic etching of the vertical semiconductor layer and the vertical insulating layer is performed in an over-etch manner, the top surface of the substrate 300 may be recessed below the channel holes CH.

Furthermore, a top surface of the layered structure TS may be exposed by the anisotropic etching of the vertical semiconductor layer and the vertical insulating layer. Accordingly, the vertical insulating materials 340 and the vertical semiconductor patterns 330 may be locally formed within the channel holes CH.

Figure 7D:
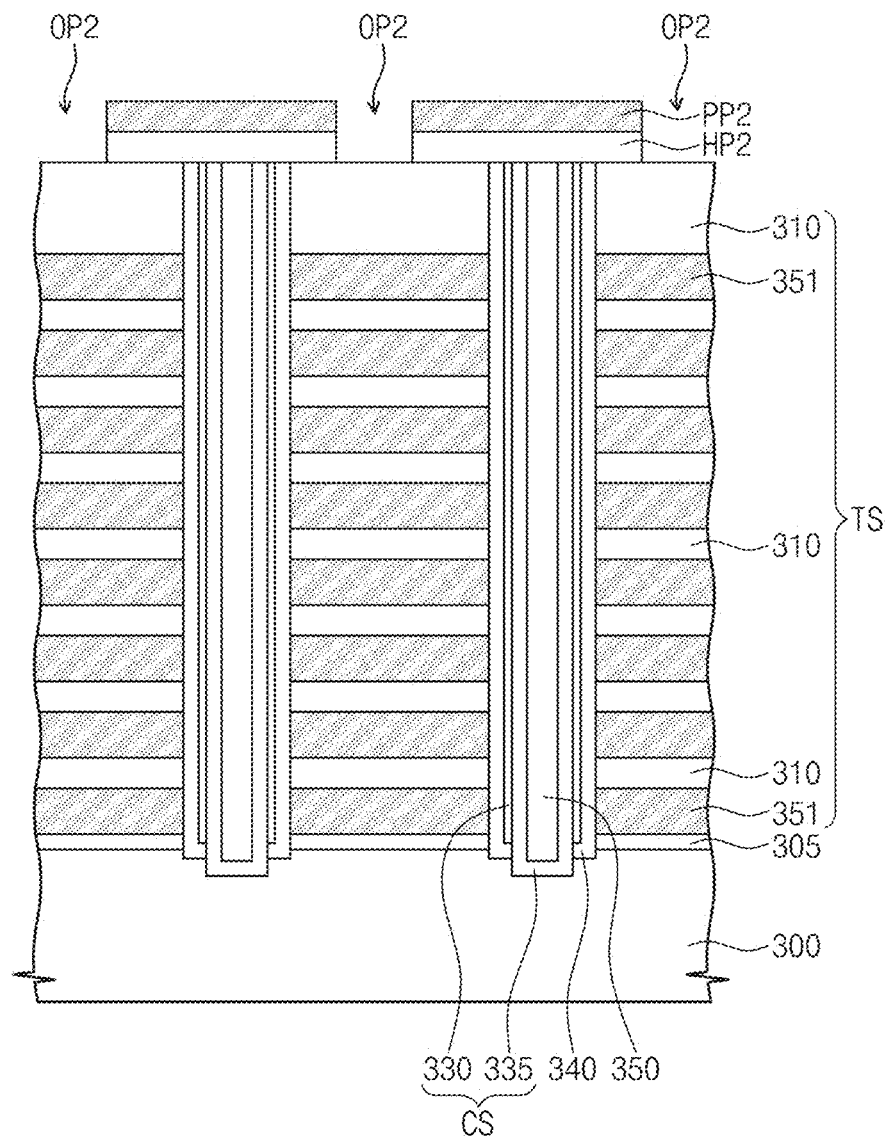

Referring to FIG. 7D, connection semiconductor patterns 335 may be formed in the channel holes CH. For example, a connection semiconductor layer (not shown) and an insulating gap-fill layer (not shown) may be formed on the resulting structure described with reference to FIG. 7C. The connection semiconductor layer may be formed so as to not fill the entirety of what remains of the channel holes CH. For example, the connection semiconductor layer may be conformally formed. The connection semiconductor layer may be formed by one of ALD and CVD processes and may be formed of a semiconductor material (e.g., may be a polysilicon layer, a single crystalline silicon layer, or an amorphous silicon layer). The insulating gap-fill layer may be formed to fill the remainder of the channel holes CH. In certain embodiments, the insulating gap-fill layer may be formed of at least one insulating material, which can be formed by a spin-on-glass (SOG) technique, or a silicon oxide layer. Subsequently, the connection semiconductor layer and the insulating gap-fill layer may be planarized to expose the top surface of the layered structure TS, and thus, the connection semiconductor patterns 335 and vertical insulating patterns 350 may be locally formed within the channel holes CH.

Each of the connection semiconductor patterns 335 may be shaped like a pipe or cylinder with a closed bottom or a cup. In other exemplary embodiments, each of the connection semiconductor patterns 335 may be shaped a like a solid pillar filling the channel hole CH. The vertical insulating patterns 350 may be formed to fill the channel holes CH provided with the connection semiconductor patterns 335. The vertical semiconductor patterns 330 and the connection semiconductor patterns 335 may constitute channel structures CS.

A second hard mask pattern HP2 and a second photoresist pattern PP2 may be formed on the layered structure TS. The second hard mask pattern HP2 and the second photoresist pattern PP2 may be formed using the same method as that for forming the hard mask pattern HP and the photoresist pattern PP previously described with reference to FIGS. 1 through 4.

The second hard mask pattern HP2 may be formed to define second openings OP2, each of which exposes a portion of the uppermost one of the insulating layers 310. Although not shown, when viewed in plan view, each of the second openings OP2 may have the shape of a line (i.e., may extend linearly in a direction parallel to the top surface of the substrate 300).

Figure 7E:
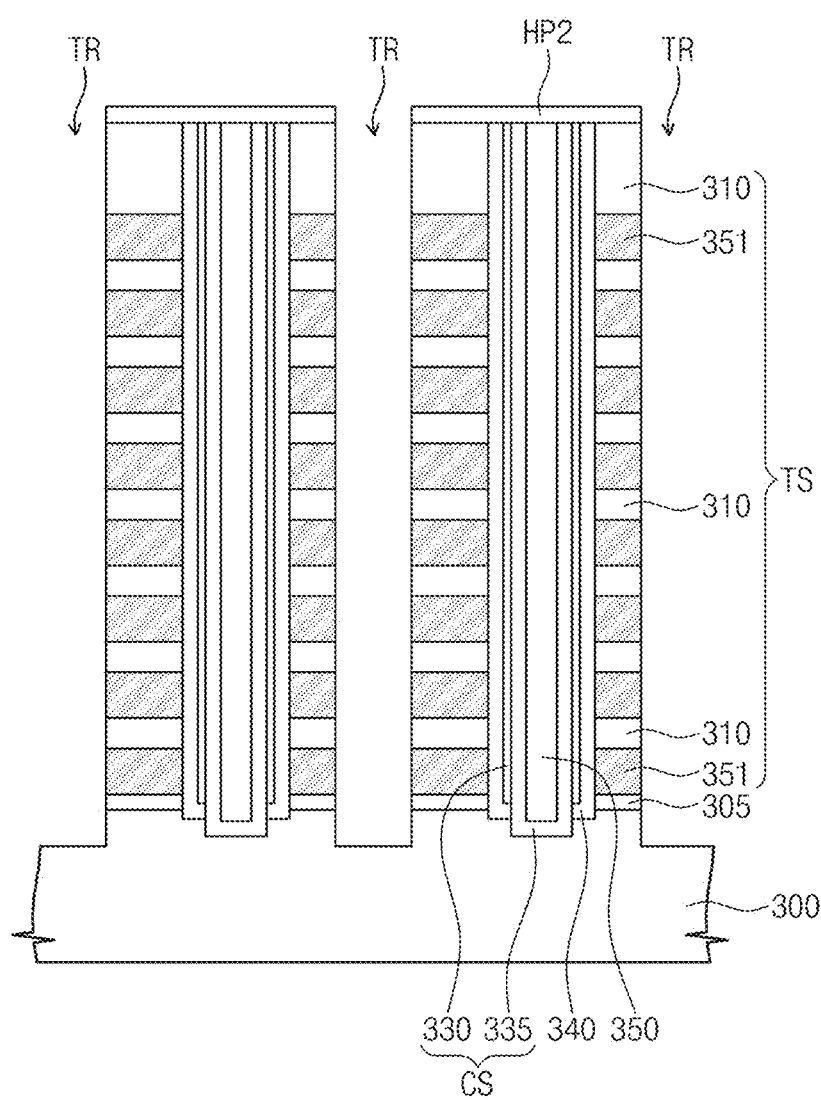

Referring to FIG. 7E, the layered structure TS may be patterned to form trenches TR exposing the substrate 300. Although not shown, when viewed in plan, the trenches TR may be formed in such a way that one or more rows of the channel holes CH are disposed between adjacent trenches of each respective pair thereof.

The trenches TR may be formed by etching the sacrificial layers 351 and the insulating layers 310 using the second hard mask pattern HP2 as an etch mask. The trenches TR may be formed in substantially the same manner as the forming of the recess regions RR previously described with reference to FIG. 5. During the etching process, the top surface of the substrate 300 may be over-etched or recessed.

After trenches TR have been formed, a remaining portion of the second hard mask pattern HP2 may be removed.

The second hard mask pattern HP2 may be used to define shapes and disposition of stacks SS, as will be described below.

Figure 7F:
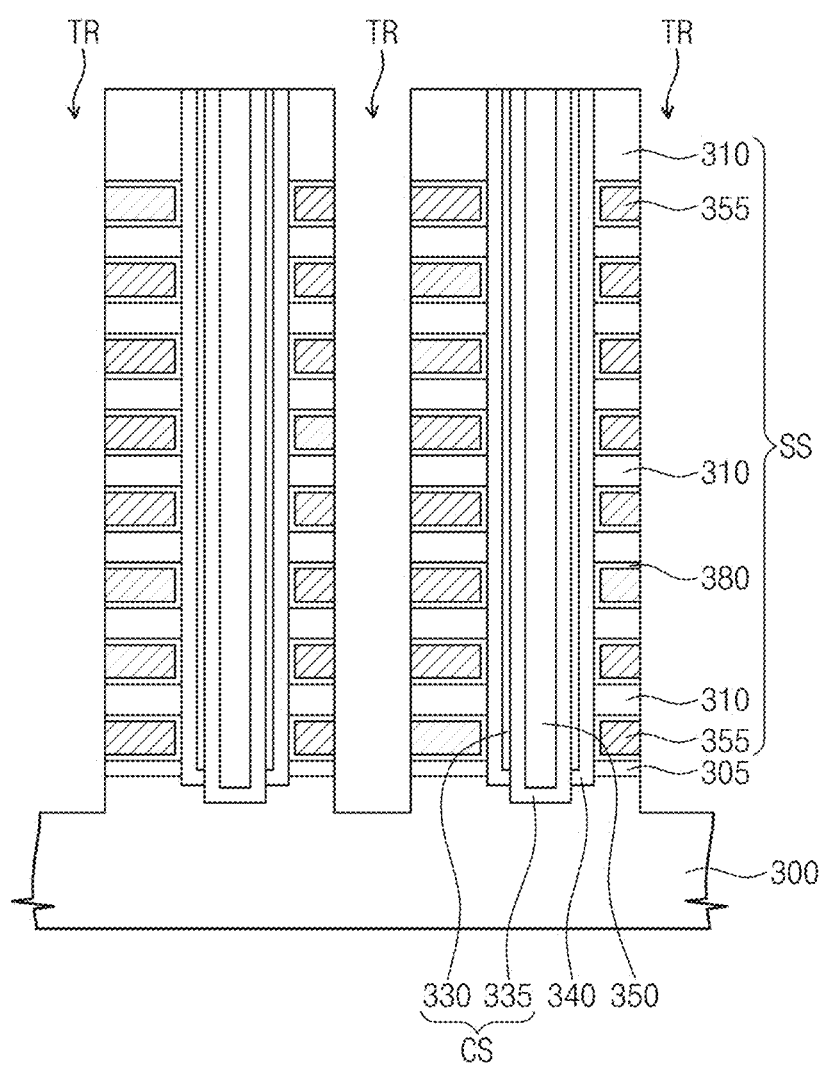

Referring to FIG. 7F, the sacrificial layers 351 exposed by the trenches TR may be removed by a selective etch process. As a result of the removal of the sacrificial layers 351, gaps may be formed between the insulating layers 310, and sidewalls of the vertical insulating materials 340 may be exposed through the gaps.

Subsequently, gate dielectric layers 380 may be formed along the gaps. Gate electrodes 355 may be formed on the gate dielectric layers 380 to fill what remains of the gaps. The gate dielectric layers 380 and the gate electrodes 355 may be formed by sequentially forming a dielectric layer (not shown) and a gate layer (not shown) (e.g., a metal layer) in the gaps, and removing the dielectric layer and the gate layer from the trenches TR.

The gate electrodes 355 and the insulating layers 310 may form a plurality of stacks SS spaced apart from each other by the trenches TR. When viewed in a plan, each of the stacks SS may be linear and extend longitudinally parallel to the trenches TR.

Figure 7G:
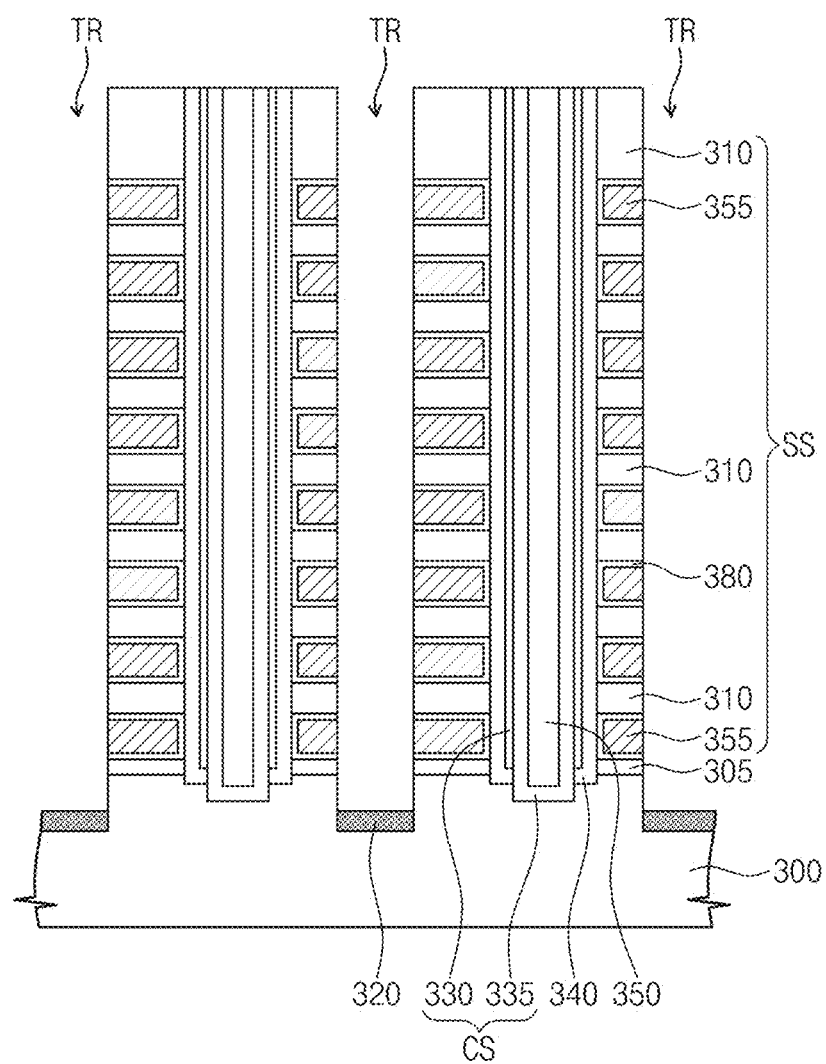

Referring to FIG. 7G, common source regions 320 may be formed in the substrate 300, after the gate electrodes 355 have been formed. The common source regions 320 may be formed by an ion implantation process, i.e., by implanting impurities in regions of the substrate 300 exposed by the trenches TR. The common source regions 320 may constitute PN junctions, in conjunction with the substrate 300. According to an example embodiment applicable to a FLASH memory device, the common source regions 320 may be connected to each other, thereby being in an equipotential state. In other embodiments, the common source regions 320 may be electrically isolated from each other, thereby having different electric potentials. In still other embodiments, the common source regions 320 may constitute a plurality of source groups, which are electrically isolated from each other, and each of which includes a plurality of common source regions 320.

Figure 7H:
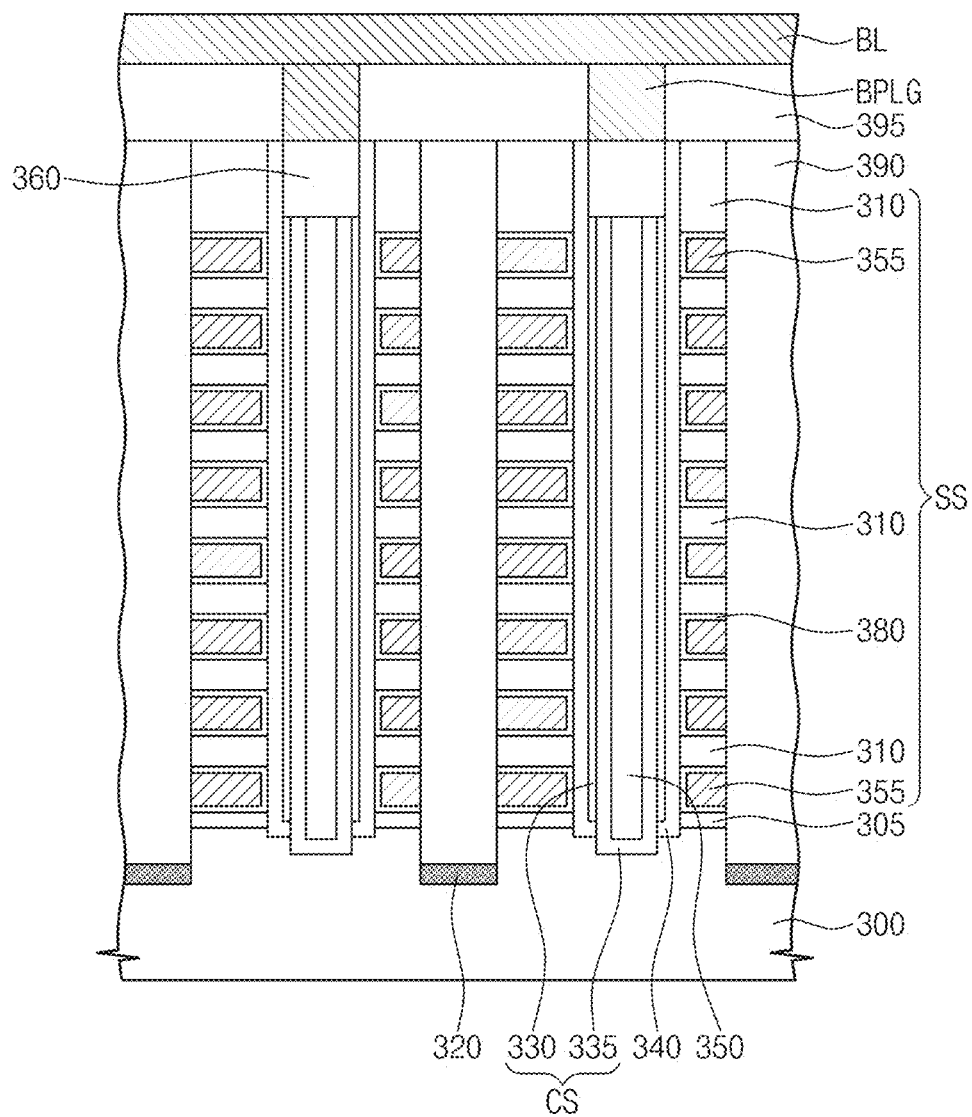

Referring to FIG. 7H, a first interlayer insulating layer 390 may be formed on the common source regions 320 to cover the stacks SS. Conductive pads 360 may be formed on and connected to the channel structures CS. In exemplary embodiments, the conductive pads 360 may be formed by recessing upper portions of the channel structures CS and forming a conductive material in the recessed regions. The conductive pads 360 may be doped to have a different conductivity type from that of the channel structures CS thereunder.

A second interlayer insulating layer 395 may be formed on the first interlayer insulating layer 390. Bit line plugs BPLG may be formed through the second interlayer insulating layer 395 and may be electrically connected to the conductive pads 360. Bit lines BL may be formed on the second interlayer insulating layer 395 to connect the bit line plugs BPLG arranged in a direction perpendicular to the trenches TR as viewed in plan.

[Other Applications]

Figure 9:
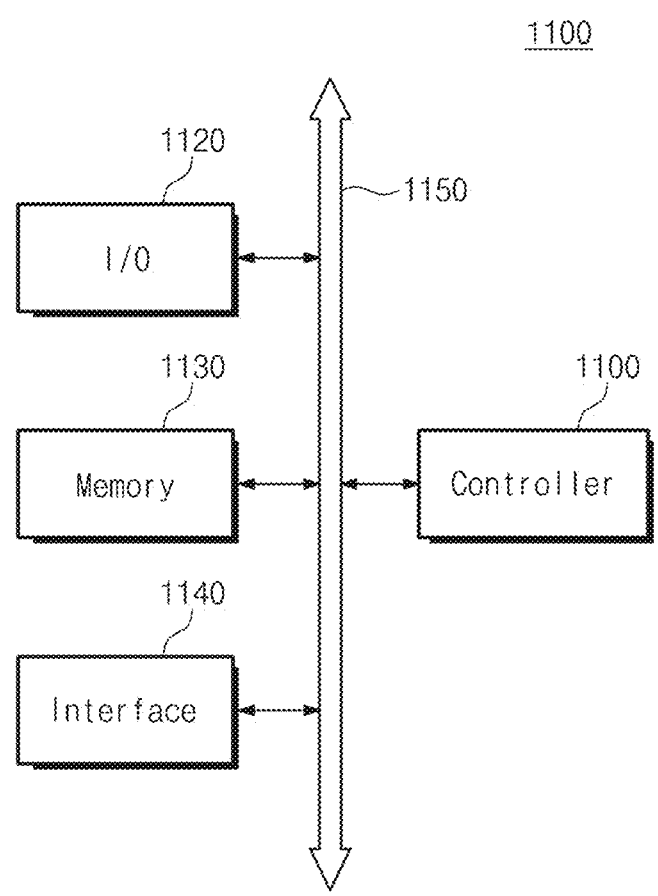
FIG. 9 is a schematic block diagram of an example of a memory system including a semiconductor device fabricated according to the inventive concept.

FIG. 9 illustrates an example of a memory system including a semiconductor device fabricated according to the inventive concept. The memory system may be employed by information processing devices such as PDAs, portable computers, web tablets, cordless phones, mobile phones, digital music players, and memory cards. Basically, the memory system may be used to realize any wired or wireless communication device.

Referring to FIG. 9, the memory system 1100 may include a controller 1110, an input-output unit 1120 (e.g., keypad or keyboard, and display), a memory 1130, an interface 1140, and a bus 1150. The memory 1130 and the interface 1140 may communicate with each other via the bus 1150.

The controller 1110 may include at least one of microprocessor, digital signal processor, a microcontroller, or the like. The memory 1130 may be configured to store data or commands processed by the controller 1110. The input-output unit 1120 may be configured to receive or output data or signals from or to the outside of the system 1100.

The memory 1130 may include a semiconductor device fabricated by any of the embodiments according to the inventive concept. The memory 1130 may further include a randomly accessible volatile memory or any other type of memory device.

The interface 1140 may be configured to receive or output data or signals from or to a communications network.

Furthermore, semiconductor devices or memory systems according to the inventive concept can be packaged using any of various types of packaging technologies. For example, a semiconductor device or a memory system fabricated according to the inventive concept can be packaged as a PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multichip package (MCP), wafer-level fabricated package (WFP), or wafer-level processed stack package (WSP).

Figure 10:
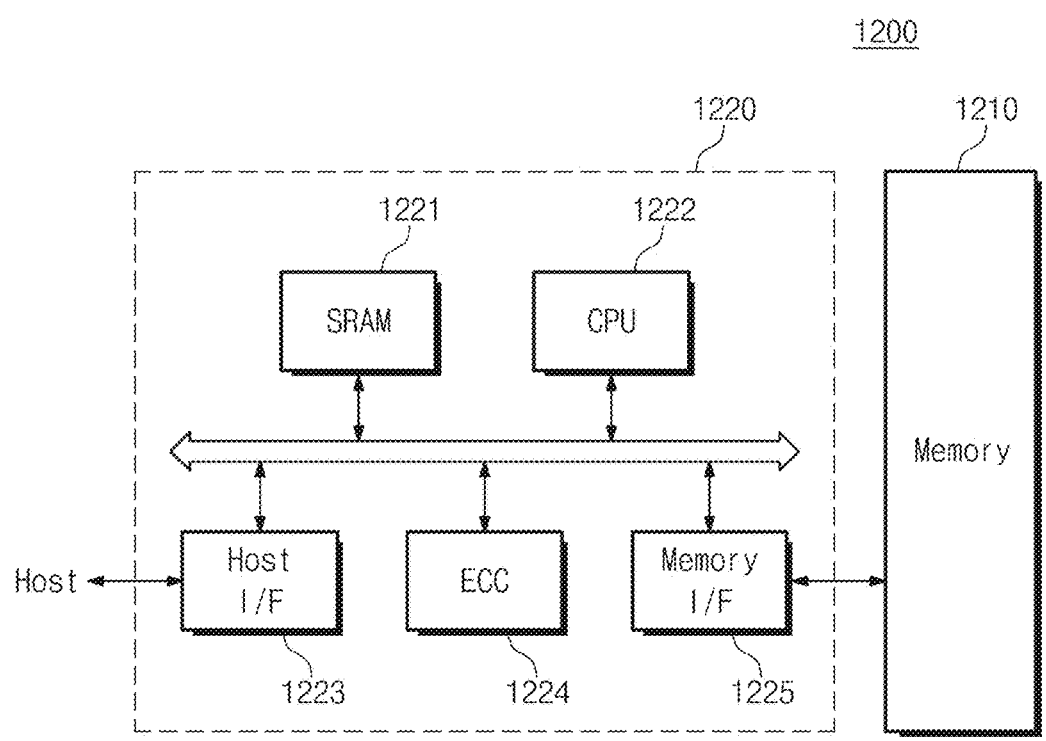
FIG. 10 is a block diagram exemplarily of an example of a memory card including a semiconductor device fabricated according to the inventive concept.

FIG. 10 is a block diagram illustrating an example of a memory card including a semiconductor device fabricated according to the inventive concept.

Referring to FIG. 10, a memory card 1200 may be configured to include a semiconductor memory device 1210 fabricated according to the inventive concept. The memory card 1200 includes a memory controller 1220 configured to control a data exchange operation between a host and the semiconductor memory device 1210.

A static random access memory (SRAM) 1221 is used as an operation memory of the processing unit 1222 of the memory controller 1220. A host interface 1223 includes data exchange protocols of a host to be connected to the memory card 1200. An error correction block 1224 detects and corrects errors included in data readout from the semiconductor memory device 1210 having memory cells, each of which is configured to store multi-bits. A memory interface 1225 interfaces with the semiconductor memory device 1210. The processing unit 1222 performs every control operation of the memory controller 1220 for exchanging data. Even though not depicted in drawings, it will be readily apparent to one of ordinary skill in the art that the memory card 1200 may further include a ROM ((not shown)) storing code for interfacing with the host.

Figure 11:
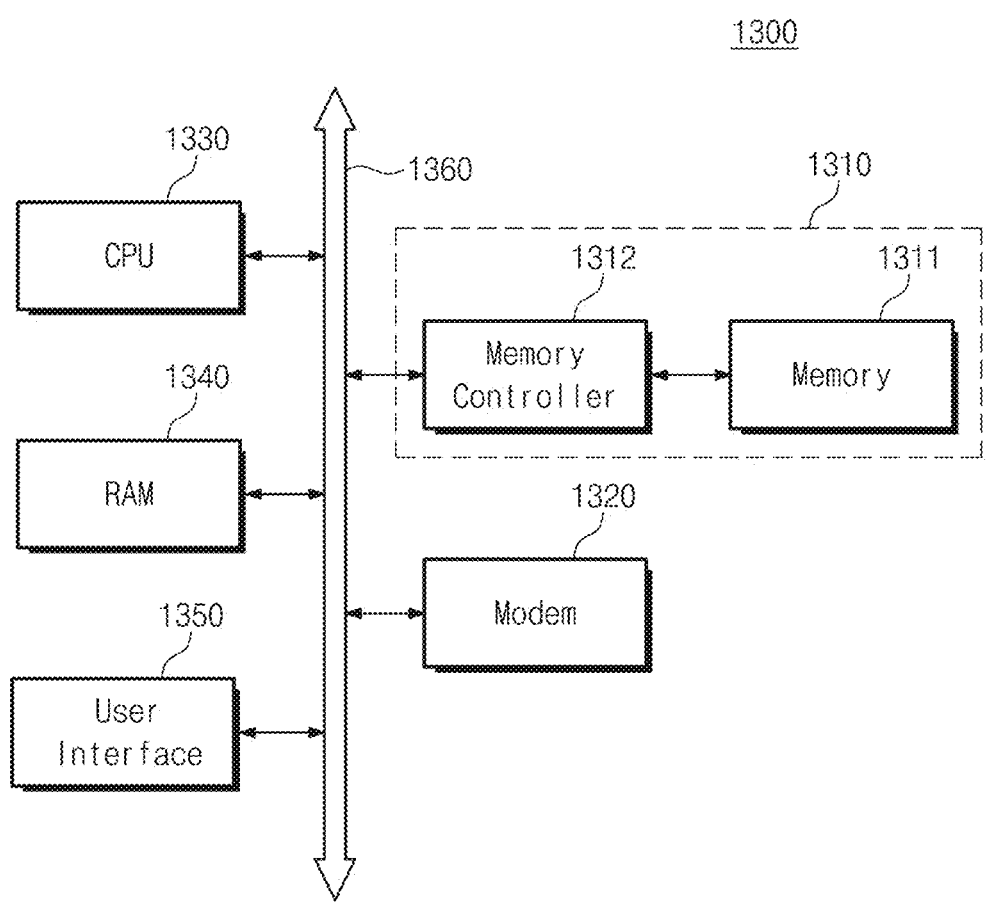
FIG. 11 is a schematic block diagram of an example of an information processing system including a semiconductor device fabricated according the inventive concept.

FIG. 11 is a schematic block diagram illustrating an example of an information processing system 1300 including a semiconductor device fabricated according to the inventive concept. For instance, the information processing system 1300 may be that of a mobile device or a desktop computer Referring to FIG. 11, the information processing system 1300 may include a memory system 1310. In exemplary embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially the same as the memory card 1200 described with respect to FIG. 10. For example, the memory device 1311 may be one of the semiconductor devices fabricated according to the inventive concept. Data processed by the CPU 1330 and/or input from the outside may be stored in the memory system 1310. In some embodiments, the memory system 1310 may be a portion of a solid state drive (SSD), and in this case, the information processing system 1300 may stably and reliably store a large amount of data in the memory system 1310. Although not illustrated, it will be apparent to those skilled in the art that, for example, an application chipset, a camera image sensor, a camera image signal processor (ISP), an input/output device, or the like may also be integrated into the information processing system 1300.

According to exemplary embodiments of the inventive concept, a method of forming a hard mask layer may include forming an amorphous carbon layer serving as a hard mask layer. When the amorphous carbon layer is formed, nitrous oxide ($N_2O$) may be supplied. The supply of the nitrous oxide ($N_2O$) may allow the hard mask layer to have excellent film uniformity and a high etch selectivity with respect to an etch-target layer. Furthermore, the use of the hard mask layer makes it possible to efficiently form a recess region with a high aspect ratio in the etch-target layer.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of forming a hard mask layer, comprising:
providing a substrate; and
introducing a source of carbon and nitrous oxide ($N_2O$) to the substrate under a plasma ambient of an inert gas to form an amorphous layer of carbon on the substrate,
wherein the nitrous oxide ($N_2O$) is provided at a flow rate ranging from 10 sccm to 1000 sccm, and
the amorphous carbon layer has a nitrogen content ranging from 0.05 at % to 30 at % and an oxygen content ranging from 0.05 at % to 10 at %.

2. The method of claim 1, wherein the nitrous oxide ($N_2O$) is excited under the plasma ambient to decompose C—C bonds in the amorphous carbon layer.

3. The method of claim 1, further comprising introducing nitrogen ($N_2$) to the substrate at the same time as the nitrous oxide ($N_2O$),
wherein a flow rate of the nitrogen ($N_2$) is 0.1 to 10 times that of the nitrous oxide ($N_2O$).

4. The method of claim 3, further comprising introducing diborane ($B_2H_6$), boron trifluoride ($BF_3$), oxygen ($O_2$), or a mixture thereof to the substrate.

5. The method of claim 1, wherein the amorphous layer of carbon is formed by chemical vapor deposition,
the source of carbon comprises at least one hydrocarbon selected from the group consisting of C2-C6 alkanes, C2-C6 alkenes, and C2-C6 alkynes, and
the flow rate of the nitrous oxide ($N_2O$) is 0.01 to 2 times that of the source of carbon.

6. The method of claim 1, wherein the amorphous layer of carbon is formed by physical vapor deposition, and the source of carbon comprises graphite.

7. A method of fabricating a semiconductor device, comprising:
forming an etch-target comprising at least one layer of silicon, silicon oxide, silicon nitride, or silicon oxynitride on a substrate;
forming a hard mask pattern on the etch-target; and
etching the etch-target using the hard mask pattern as an etch mask to form a recessed region in which an opening extends vertically in the etch-target from an upper surface of the etch-target,
wherein the forming of the hard mask pattern comprises:
introducing a source of carbon, nitrogen ($N_2$) and nitrous oxide ($N_2O$) onto the etch-target under a plasma ambient of an inert gas to form an amorphous carbon layer on the etch-target, wherein the amorphous carbon layer has a nitrogen content ranging from 0.05 at % to 30 at % and an oxygen content ranging from 0.05 at % to 10 at %, and an atomic percentage of nitrogen atoms in the amorphous carbon layer is higher than that of oxygen atoms in the amorphous carbon layer, and
in the etching of the etch-target, the amorphous carbon layer has an etch selectivity ranging from 2 to 50 with respect to each said at least one layer of silicon, silicon oxide, silicon nitride, or silicon oxynitride of the etch-target.

8. The method of claim 7, wherein the opening defined by the recess region is formed to have an aspect ratio ranging from 5 to 100.

9. The method of claim 7, before the forming of the etch-target, further comprising:
forming a device isolation pattern on the substrate to define an active pattern;
forming a gate electrode buried in the substrate to cross the active pattern; and
forming a first impurity region and a second impurity region in the active pattern adjacent both sides of the gate electrode.

10. The method of claim 9, wherein the forming of the etch-target comprises forming an insulating layer of silicon, silicon oxide, silicon nitride, or silicon oxynitride on the active pattern, and
the opening defined by the recess region is formed to expose the first or second impurity region, thereby serving as a contact hole.

11. The method of claim 7, wherein the forming of the etch-target comprises alternately and repeatedly forming sacrificial layers and insulating layers one upon the other on the substrate to form a layered structure, each of the insulating layers being a layer of silicon, silicon oxide, silicon nitride, or silicon oxynitride, and
the opening defined by the recess region is formed to expose the substrate through the layered structure, thereby serving as a channel hole.

12. The method of claim 7, wherein the forming of the etch-target comprises alternately and repeatedly forming sacrificial layers and insulating layers one atop the other on the substrate to form a layered structure, each of the insulating layers being a layer of silicon, silicon oxide, silicon nitride, or silicon oxynitride, and the opening defined by the recess region is formed to expose the substrate through the layered structure and is elongated in a direction parallel to a top surface of the substrate as viewed in plan, thereby serving as a trench.

13. The method of claim 7, wherein the nitrous oxide ($N_2O$) and the nitrogen ($N_2$) are provided at respective flow rates with the flow rate of the nitrogen ($N_2$) being 0.1 to 10 times that of the nitrous oxide ($N_2O$).

14. A method for use in the fabricating of a semiconductor device, comprising:

supporting a substrate in a process chamber;

producing in the process chamber a plasma of inert gas in the ambient environment of the substrate under a pressure substantially in a range of 2 Torr to 100 Torr and at a temperature substantially in a range of 200° C. to 600° C.; and forming an amorphous layer of carbon on the substrate including by introducing a source of carbon, nitrogen ($N_2$) and nitrous oxide ($N_2O$) to the substrate through the plasma of inert gas such that the amorphous layer of carbon contains nitrogen in an atomic percentage substantially in a range of 0.05 at % to 30 at % and oxygen in an atomic percentage substantially in a range 0.05 at % to 10 at %, and the atomic percentage of nitrogen in the amorphous layer of carbon is higher than the atomic percentage of oxygen in the amorphous layer of carbon.

15. The method of claim 14, wherein the amorphous layer of carbon is formed by chemical vapor deposition, the source of carbon is source gas consisting of at least one of $CH_4$, $C_2H_2$, $C_3H_6$, $C_6H_6$, $C_6H_{12}$, and $C_6H_{14}$, and the nitrous oxide and the source gas are injected into the process chamber at respective flow rates with the flow rate of the nitrous oxide ($N_2O$) being 0.01 to 2 times that of the source gas.

16. The method of claim 14, wherein the amorphous layer of carbon is formed by physical vapor deposition, and the source of carbon is graphite.

17. The method of claim 14, further wherein the nitrous oxide ($N_2O$) and the nitrogen ($N_2$) are injected at the same time into the process chamber at respective flow rates with the flow rate of the nitrogen ($N_2$) being 0.1 to 10 times that of the nitrous oxide ($N_2O$).

18. The method of claim 14, further comprising patterning the amorphous layer of carbon, and etching material disposed beneath the amorphous layer of carbon using the patterned amorphous layer of carbon as a hard mask.

* * * * *